United States Patent
Matsuoka

[11] Patent Number: 5,912,851
[45] Date of Patent: Jun. 15, 1999

[54] MULTI-BIT SEMICONDUCTOR MEMORY DEVICE ALLOWING EFFICIENT TESTING

[75] Inventor: Hideto Matsuoka, Hyogo, Japan

[73] Assignees: Mitsubishi Denki Kabushiki Kaisha; Mitsubishi Electric Engineering Co., Ltd., both of Tokyo, Japan

[21] Appl. No.: 08/988,208

[22] Filed: Dec. 10, 1997

[30] Foreign Application Priority Data

Jun. 5, 1997 [JP] Japan .................................. 9-147928

[51] Int. Cl.$^6$ ....................................................... G11C 7/00
[52] U.S. Cl. ............... 365/201; 365/189.01; 365/189.07; 365/230.05
[58] Field of Search ............................... 365/201, 189.05, 365/230.03, 230.08, 230.05, 189.01, 189.07

[56] References Cited

U.S. PATENT DOCUMENTS 5,214,609  5/1993  Kato et al. ........................ 365/189.05
5,777,942  7/1998  Dosaka et al. ..................... 365/230.09

FOREIGN PATENT DOCUMENTS 5-325598  12/1993  Japan .

*Primary Examiner*—David Nelms
*Assistant Examiner*—David Lam
*Attorney, Agent, or Firm*—McDermott, Will & Emery

[57] ABSTRACT

Data supplied to a particular data input/output terminal is selected and the selected data is subjected to logic change for each memory cell based on mode setting data from a changing mode setting circuit and is simultaneously written into memory cells simultaneously selected in a memory array. After a reading logic changing circuit changes the data of these simultaneously selected memory cells in the same manner as the writing logic changing circuit does, a coincidence/non-coincidence among the logics of these data is determined, and a signal representing a logic in coincidence is output if a coincidence is found. Thus, testing can be achieved at a high speed and accurately, using test data having various patterns, without increasing the number of data input/output terminals used in the testing operation.

18 Claims, 16 Drawing Sheets

MULTI-BIT SEMICONDUCTOR MEMORY DEVICE ALLOWING EFFICIENT TESTING

BACKGROUND OF THE INVENTION

1. Field of the Invention

The present invention relates generally to semiconductor memory devices, and more particularly, to the configuration of data writing/reading circuitry in a semiconductor memory device having a plurality of data input/output nodes (I/O terminals). More particularly, the present invention relates to a configuration for efficiently testing a semiconductor memory device having a plurality of data input/output terminals.

2. Description of the Background Art

In semiconductor memory devices, various tests are performed in order to insure the reliability of products. One such test includes a fault detection test to detect whether or not data is accurately written/read out. In such a test, a single testing apparatus is used to simultaneously observe a plurality of semiconductor memory devices. In such a case, the number of semiconductor memory devices which can be observed at a time depends on the number of data input/output terminals of each semiconductor memory device. During writing/reading test data using all the 16 data input/output terminals of a 16-I/O-semiconductor memory device, the number of devices can be observed at a time is ½ that of an 8-I/O-semiconductor memory device having 8 data input/output terminals. Therefore, if a multi-I/O-semiconductor memory device having a plurality of data input/output terminals can be tested using a reduced number of data input/output terminals (I/O) (I/O compression), the number of semiconductor memory devices which can be measured at a time can be increased, thereby allowing efficient testing of the devices.

FIG. 24 is a diagram schematically showing an overall configuration of a semiconductor memory device having a conventional I/O compression circuit. In FIG. 24, semiconductor memory device 500 includes memory arrays 502a, 502b, 502c and 502d each having a plurality of memory cells, X decoders 504a, 504b, 504c and 504d provided respectively to memory arrays 502a to 502d for decoding an applied X address signal and driving an addressed row in a corresponding memory array into a selected state, and Y decoders 506a to 506d provided respectively to memory arrays 502a to 502d for decoding an applied Y address signal and simultaneously selecting memory cells of 4 bits in a corresponding memory array.

Semiconductor memory device 500 has 16 bit—data input/output terminals labeled terminal I/O<0–15>, and memory cells of 4 bits are selected at a time in each of memory arrays 502a to 502d. The memory cells of 4 bits selected at a time in each of memory arrays 502a to 502d are coupled to internal data buses 508a, 508b, 508c and 508d provided respectively to memory arrays 502a to 502d.

Semiconductor memory device 500 further includes an input/output circuit 510 for receiving externally applied data input and externally outputting data through data input/output terminal I/O<0–15>, a test mode detection circuit 512 for detecting a test mode being specified based on the states of externally applied control signals, in other words a row address strobe signal /RAS, a column address strobe signal /CAS and a write enable signal /WE, a compression circuit 514 for compressing 16-bit memory cell data read out on internal data buses 508a to 508d into 1-bit data, and a selector circuit 516 for selecting a data transfer path between input/output circuit 510 and internal data buses 508a to 508d in response to a test mode activation signal φTM from test mode detection circuit 512.

Input/output circuit 510 transfers data DI<0> among writing data DI<0–15> applied to data input/output terminal I/O<0–15> to an internal writing data bus 515a, and the remaining 15 bit writing data DI<1–15> to a writing data bus 515b, and outputs in parallel 16-bit data DO<0–15> provided from selector circuit 516 on an internal reading data bus 515c to data input/output terminal I/O<0–15>.

Selector circuit 516 has an input node TMI coupled to internal writing data bus 515a, an input node NMI coupled to internal writing data bus 515b, a data output node DO<0–15> coupled to internal reading data bus 515c, a node TMO receiving the output signal of compression circuit 514, data input/output nodes IO<0–3>, IO<4–7>, IO<8–11>, and IO<12–15> coupled to internal data buses 508a to 508d, respectively, and a test mode signal input node TM receiving test mode activation signal φTM. Now, the operation will be briefly described.

In memory arrays 502a to 502d, memory cells of four bits are simultaneously selected by X decoders 504a to 504d and Y decoders 506a to 506d, and these selected memory cells are coupled to corresponding internal data buses 508a to 508d.

During data writing in a normal operation mode, test mode activation signal φTM is in an inactive state. In this state, selector circuit 516 transfers data DI<0> and DI<1–15> provided onto internal writing data buses 515a and 515b from input/output circuit 510 to internal data buses 508a to 508d, respectively. As shown in FIG. 24, memory arrays 502a to 502d correspond to I/O<0–3>, I/O<4–7>, IO<8–11> and IO<12–15>, respectively. Thus, 16 bits of data are simultaneously written.

During reading data in a normal mode of operation, selector circuit 516 transfers data read out on internal data buses 508a to 508d onto internal reading bus 515c, because test mode activation signal φTM is in an inactive state. Input/output circuit 510 has its output circuit portion activated, and outputs in parallel data DO<0–15> on internal reading bus 515c to data input/output terminal I/O<0–15>.

When test mode activation signal φTM is in an active state, during writing data, selector circuit 516 selects data DI<0> (TMI) provided onto internal writing bus 515a from input/output circuit 510 to internal data buses 508a to 508d. Thus, the same data is simultaneously written to memory cells of 16 bits. During reading out data, compression circuit 514 compresses the 16 bit-data read out on internal data buses 508a to 508d through a prescribed logic processing, into 1-bit data for application to the node TMO of selector circuit 516. When test mode activation signal φTM is activated, selector circuit 516 selects the compressed data applied to node TMO and applies the selected data to input/output circuit 510 as DO<0> for output to data input/output terminal I/O<0>.

Therefore in the semiconductor memory device as shown in FIG. 24, in the test mode, test data can be written and test result data can be read out using a single data input/output terminal I/O<0>, and the number of data input/output terminals used for testing can be reduced.

FIG. 25 is a diagram showing an example of the configuration of compression circuit 514 shown in FIG. 24. In FIG. 25, compression circuit 514 includes 8 coincidence detection circuits (EXOR circuits) 510a, 514b ... 514h each receiving 2-bit data of a prescribed combination among 16 bit-data D0 to D15 read out onto internal data buses 508a to 508d (see FIG. 24), an NOR circuit 514i receiving the output signals of these coincidence detection circuits 514a to 514h, and an inverter circuit 514j receiving the output signal of NOR 514i. Compression test result data TMO is output from NOR circuit 514i, and inverted compression test result data ITMO (a node and a signal on the node are denoted by the same reference character) is output from inverter circuit 514a.

In the configuration of compression circuit 514 shown in FIG. 25, if the logic levels of reading data D0 to D15 are all in coincidence, the output signal TMO of NOR circuit 514i attains an H level ("1"). If data D0 to D15 includes "0" (L level) data and "1" (H level) data, the output signal of at least one of coincidence detection circuits 514a to 514h attains an H level, and the output signal TMO of NOR circuit 514i attains an L level ("0") accordingly. If, therefore, it is externally determined whether test result signal TMO is at an H level or an L level, it can be determined whether all the logic levels of data D0 to D15 are in coincidence, or different logic data are mixedly present, and the presence/absence of a fault in the memory cells of 16 bits selected at a time can be identified.

In the configuration of compression circuit 514 shown in FIG. 25, however, if a pair of data both have a logic level inverted from that of writing data, the output signal of the coincidence detection circuit is a signal representing a normal state (L level). If, therefore, an address storing "FFFF (HEX)" is erroneously accessed while an address storing "0000 (HEX)" should be accessed, for example, the fault cannot be detected. Therefore in the compression circuit as shown in FIG. 25, the fault/non-fault of a memory cell cannot be accurately determined.

FIG. 26 is a diagram showing another configuration of the compression circuit shown in FIG. 24. In FIG. 26, an output circuit 510a to output compression test result data is also shown.

In FIG. 26, compression circuit 514 includes an NAND circuit 514k receiving internal reading data D0 to D15, an NOR circuit 514l receiving internal reading data D0 to D15, an NOR circuit 514m receiving the output signal of NAND circuit 514k and the output signal of NOR circuit 514l, an EXOR circuit 514n receiving the output signal of NAND circuit 514k and the output signal of NOR circuit 514l, an inverter circuit 514o receiving the output signal of NOR circuit 514m, an NOR circuit 514p receiving the output signal of inverter circuit 514o and the output signal of EXOR circuit 514n, and an NOR circuit 514q receiving the output signal of NOR circuit 514m and the output signal of EXOR circuit 514n. Compression test result data is output through node TMO from NOR circuit 514p, and inverted compression test result data is output through node ITMO from NOR circuit 514q.

Output circuit 510a is included in input/output circuit 510 shown in FIG. 24, and outputs the compression test result data to data input/output terminal I/O<0>. Output circuit 510a includes an n channel MOS transistor 510aa connected between the power supply node and the output node and having a gate receiving the output signal of NOR circuit 514p in compression circuit 514, and an n channel MOS transistor 510ab connected between the output node and the ground node and having a gate receiving the output signal of NOR circuit 514q. Now, the operation of the compression circuit as shown in FIG. 26 will be described.

When the logics of internal reading data D0 to D15 are all "1" (at H level), the output signal of NAND circuit 514k is at an L level, and the output signal of NOR circuit 514l is at an L level. The output signal of NOR circuit 514m attains an H level as a result, and the output signal of inverter circuit 514o attains an L level accordingly. Since EXOR circuit 514n receives L level signals at both inputs, the output signal of the circuit attains an L level. Therefore, the output signal of NOR circuit 514p attains an H level, and the output signal of NOR circuit 514q attains an L level. In output circuit 510a, MOS transistor 510aa is turned on, while MOS transistor 510ab is turned off, and output signal OUT attains an H level. More specifically, if internal reading data D0 to D15 are all at an H level, an H level signal is externally output.

If internal reading data D0 to D15 are all at an L level ("0"), the output signal of NAND circuit 514k attains an H level, and the output signal of NOR circuit 514l attains an H level. In this state, the output signal of NOR circuit 514m attains an L level, and the output signal of inverter circuit 514o attains an H level. EXOR circuit 514n receives H level signals at its both inputs, and therefore the output signal from the circuit 514n attains an L level accordingly. Therefore, an L level signal is output from NOR circuit 514p, and an H level signal is output from NOR circuit 514q. Therefore, in output circuit 510a, MOS transistor 510aa is turned off, and MOS transistor 510ab is turned on, and output signal OUT attains an L level. More specifically, if internal reading data D0 to D15 are all at an L level, output signal OUT also attains an L level.

If internal reading data D0 to D15 include both H level data and L level data, the output signal of NAND circuit 514k attains an H level, and the output signal of NOR circuit 514l attains an L level. The output signal of NOR circuit 514m attains an L level accordingly, and the output signal of inverter circuit 514o attains an H level. EXOR circuit 514n receives an H level signal and an L level signal, and therefore the output signal of the circuit 514n attains an H level. The output signals of NOR circuits 514p and 514q both attain an L level, MOS transistors 510aa and 510ab are both turned off accordingly, and output circuit 510a attains an output high impedance state. More specifically, if a fault is present in a memory cell, and H level data and L level data are mixedly present, output circuit 510a attains an output high impedance state.

Therefore, in the configuration shown in FIG. 26, the presence/absence of a fault in simultaneously selected memory cell data can be determined, and the presence/absence of all bit inversion can be identified by comparing the logic levels of the read out data and written data.

However, if an output high impedance state is attained in the presence of a fault cell, using the compression circuit as shown in FIG. 26, it is difficult to determine if the output is in a high impedance state in a short test data reading cycle as will be described.

FIG. 27 is a diagram showing a configuration for identifying an output high impedance state. In FIG. 27, the output node of output circuit 510a is connected to a signal line 515. Signal line 515 is connected to a resistor R receiving intermediate voltage VT at its one end. Signal line 515 has parasitic capacitance C. By identifying the voltage level on signal line 515 using a testing apparatus, the logic of compression test result data is determined. Intermediate voltage VT is at the voltage level intermediate between power supply voltage Vdd and ground voltage Vss.

Signal line 515 is driven to the power supply voltage Vdd level by MOS transistor 510aa or discharged to the ground voltage level through MOS transistor 510ab when a selected memory cell is normal. When output circuit 510a attains an output high impedance state, signal line 515 has its voltage level changed from the H level voltage or L level voltage to the intermediate voltage VT level. The voltage changing rate of signal line 515 depends on its time constant determined by resistor element R and parasitic capacitance C.

Therefore, as shown in FIG. 28, if the voltage level is changed from H level voltage VOH or L level voltage VOL to intermediate voltage VT, the voltage change of signal line 515 becomes gentle due to the time constant of resistor element R and parasitic capacitance C. More specifically, the time T2 until a high impedance state is determined (the time required for the voltage level to change from H level voltage VH or L level voltage VOL to intermediate voltage VT)increases.

In order to determine the output high impedance state of output circuit 510a in a shorter time period, the resistance value of resistor element R should be reduced and the time constant by resistor element R and parasitic capacitance C should be reduced. However, if the resistance value of resistor element R is reduced, signal line 515 is connected to the node supplying intermediate voltage VT through reduced resistance, in which case signal line 515 cannot be driven to power supply voltage Vdd level, or to the ground voltage level (the voltage level is determined based on the ratio of the resistance value of resistor element R and the on resistance of MOS transistor 510aa or 510ab), and the amplitude of signal line 515 is reduced, which makes it difficult to accurately determine the H level and L level.

If the voltage of signal line 515 fully swings, the time required for charging to the power supply voltage Vdd level through MOS transistor 510aa or time T1 until signal line 515 is discharged to the ground voltage level through MOS transistor 510ab is increased, and time required for determining the H level and L level of the output of output circuit 510a is increased, in other words the testing cycle time cannot be reduced. As a result, the resistance value of resistor element R cannot be reduced, and the high impedance state cannot be determined in a short time period, which makes it difficult to reduce the testing cycle time.

Furthermore, in the compression circuit as shown in FIGS. 25 and 26, data of the same logic is written as data D0 to D15. Therefore, a test requiring data to be changed for each data input/output terminal in order to detect a fault due to cross talk of internal data bus or the like cannot be conducted.

SUMMARY OF THE INVENTION

It is an object of the invention to provide a semiconductor memory device allowing more flexible test data patterns and capable of accurately determining the fault/non-fault state of a memory cell at a high speed.

A semiconductor memory device according to a first aspect of the invention includes a plurality of data input/output nodes, a memory array having a plurality of memory cells, a circuit for simultaneously selecting memory cells equal in number to at least the data input/output nodes from the memory array, a writing change circuit for setting a logic level of data provided from a prescribed one of the data input/output nodes for the memory cells independently from each other in a particular operation mode, and a circuit for simultaneously writing data from the writing change circuit to the memory cells simultaneously selected.

A semiconductor memory device according to a second aspect of the invention includes a memory array having a plurality of memory cells, a plurality of data input/output nodes, a circuit for simultaneously selecting memory cells equal in number to at least the data input/output nodes in the memory array, a first logic determination circuit for determining the coincidence/non-coincidence of the logic levels of data read out from the simultaneously selected memory cells and outputting a signal indicating the logic level in coincidence when a coincidences is found to a first one of the plurality of data input/output nodes, and a second determination circuit for determining the coincidence/non-coincidence of the logic levels of data read out from the simultaneously selected memory cells, and outputting a signal representing the result of determination to a second one of the plurality of data input/output nodes.

Since particular test data provided from the data input/output node is individually independently changed for the memory cells, a test data pattern internally can be changed even if the test data pattern is written using a single data input/output node, the flexibility of test data patterns can be improved, and therefore highly reliable testing can be achieved.

Furthermore, the coincidence/non-coincidence of the logics of data read out from memory cells simultaneously selected at the time of reading is determined, a signal indicating the logic in coincidence is output to the first data input/output node when a coincidence is found, while the coincidence/non-coincidence of the logic levels of data of these simultaneously selected memory cells is determined and a signal indicating the determination result is output to the second data input/output node, and therefore the coincidence/non-coincidence of the logic levels of data of these simultaneously selected memory cells can be determined at a high speed. Furthermore, when no coincidence is found by viewing the output signals of the first and second logic determination circuits, the test result can be determined at a high speed without driving a particular data input/output node into a high impedance state, which reduces the test cycle period.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Principle Configuration]

Figure 1A:
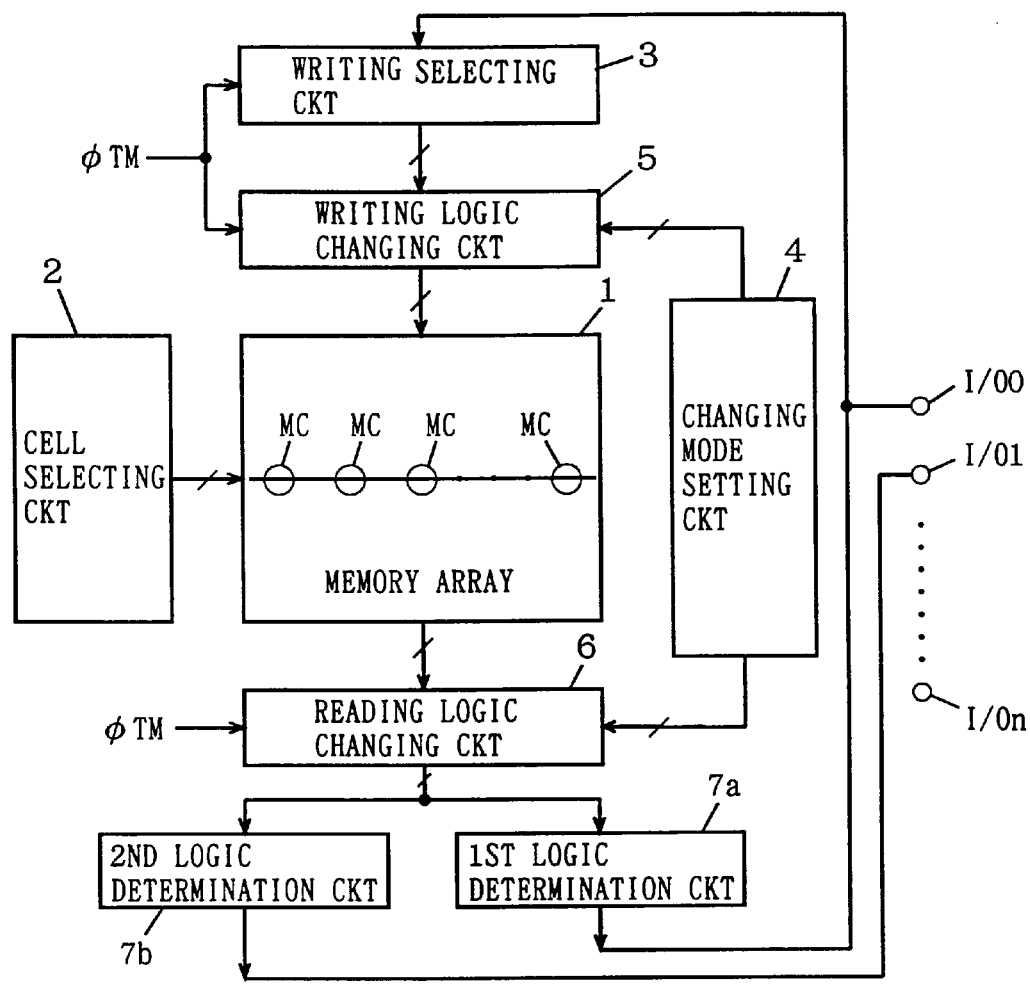
FIG. 1A is a diagram showing the conceptional configuration of a semiconductor memory device according to the present invention.

FIG. 1A is a diagram showing a principle configuration of a semiconductor memory device according to the present invention. In FIG. 1A, the semiconductor memory device includes a memory array 1 having a plurality of memory cells MC, a cell selecting circuit 2 for simultaneously selecting a prescribed number of memory cells MC in memory array 1, a writing selecting circuit 3 for transmitting data provided from a prescribed data input/output node I/O0 to the simultaneously selected prescribed number of memory cells when a test mode activation signal φTM is activated, a change mode setting circuit 4 for setting how to change data to be written into the simultaneously selected prescribed number of memory cells, and a writing logic changing circuit 5 for changing data provided from writing selecting circuit 3 for every prescribed number of memory cells according to changing mode setting data from changing mode setting circuit 4 and writing the changed data into the simultaneously selected prescribed number of memory cells in memory array 1. Writing logic changing circuit 5 changes the logic of received writing data according to changing mode setting data from changing mode setting circuit 4 for the simultaneously selected prescribed number of memory cells MC independently (independently from each other).

The semiconductor memory device further includes a reading logic changing circuit 6 for reading out the data of a prescribed number of memory cells simultaneously selected in memory array 1 and changing the logics of the individual read out data according to changing mode setting data from changing mode setting circuit 4 when test mode activation signal φTM is activated, and first and second logic determination portions 7a and 7b receiving memory cell data having their logics changed by reading logic changing circuit 6 and for producing a signal indicating whether a defective cell is present in the selected memory cells based on the result of determining the coincidence/non-coincidence of the logics of the data of these prescribed number of memory cells. The output signal of first logic determination portion 7a is applied to a prescribed data input/output node I/O0, and the output signal of second logic determination portion 7b is externally output through data input/output node I/O1. The semiconductor memory device has data input/output nodes I/O0 to I/On, and can be tested using two data input/output nodes (terminals) at maximum in the test mode.

Figure 1B:
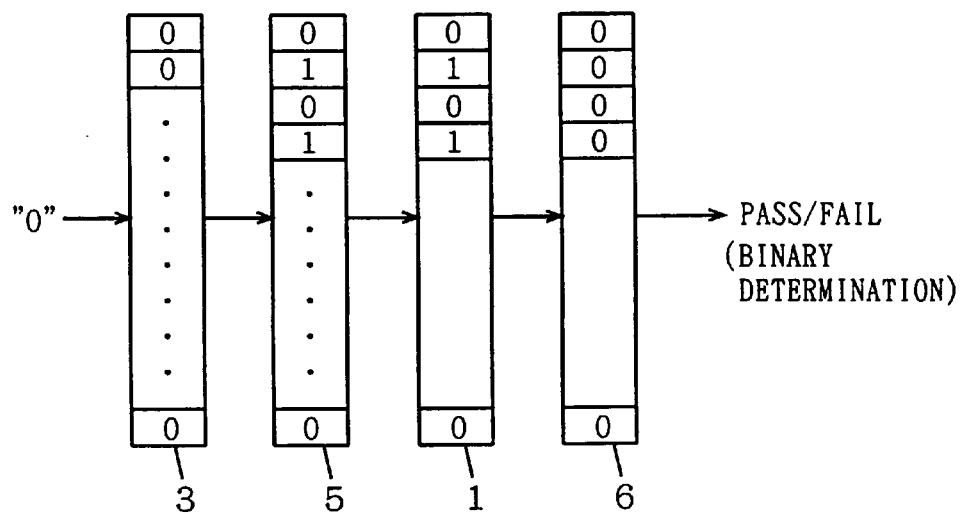
FIG. 1B is a diagram showing the flow of data during testing operation.

FIG. 1B is a diagram schematically showing the flow of data when the semiconductor memory device shown in FIG. 1A is tested. In FIG. 1B, the operation of the device is shown in the case in which data "0" (L level) is provided to data input/output node I/O0 as test data.

In memory array 1, cell selecting circuit 2 simultaneously drive into a selected state a prescribed number of memory cells at least as many as data input/output nodes I/O0 to I/On. Writing selecting circuit 3 has output nodes corresponding to the simultaneously selected prescribed number of memory cells, and outputs 1-bit data received from data input/output node I/O0 to an output node corresponding to each memory cell. Thus, the output node of writing selecting circuit 3 outputs data "0" to each memory cell. Writing logic changing circuit 5 changes the logic level of data received from writing selecting circuit 3 according to changing mode setting data from changing mode setting circuit 4. In FIG. 1B, the case of inverting the logics of data of alternate memory cells is shown by way of illustration. Therefore, the output nodes of writing logic changing circuit 5 alternately receive data "0" and "1". The data of writing logic changing circuit 5 are written into selected memory cells in memory array 1.

Reading logic changing circuit 6 changes the logic levels of data read out from memory array 1 according to the changing mode setting data. Writing logic changing circuit 5 and reading logic changing circuit 6 receive the same changing mode setting data from changing mode setting circuit 4. Therefore, reading logic changing circuit 6 changes the logic levels of data read out from the selected memory cells in the same logic changing manner as writing logic changing circuit 5 does. Therefore, at the time of writing test data, logic-inverted data stored in a memory cell is again logically inverted.

Therefore, if the simultaneously selected memory cells are all normal, the output data of reading logic changing circuit 6 is all "0" as is with the output data of writing select circuit 3. First and second logic determination portions 7a and 7b determine the coincidence/non-coincidence of logics of data supplied from reading logic changing circuit 6, and each output a signal indicating whether a defective cell is present in the simultaneously selected memory cells based on the result of determination.

The logic determining operations of first and second logic determination portions 7a and 7b are different from each other as will be described. One of them produces an exclusive OR of data supplied from reading logic changing circuit 6, and outputs a signal representing the result of the exclusive OR. The other determines the coincidence/non-coincidence of logic levels and outputs a signal indicating the logic in coincidence if a coincidence is found, and otherwise outputs a signal corresponding to one of binary levels. Thus, first and second logic determination portions 7a and 7b both perform binary determination operation, rather than ternary determination including a high impedance state, and therefore the test cycle can be reduced without the necessity of high impedance state determination. Writing logic changing circuit 5 can write test data of a desired pattern into selected memory cells in memory array 1 according to changing mode setting data from changing mode setting circuit 4, a desired test data pattern can be internally produced even if the test data is written using only a single data input/output node I/O, which enables faults caused by crosstalk or the like to be readily determined, and highly reliable testing can be achieved.

First Embodiment

Figure 2:
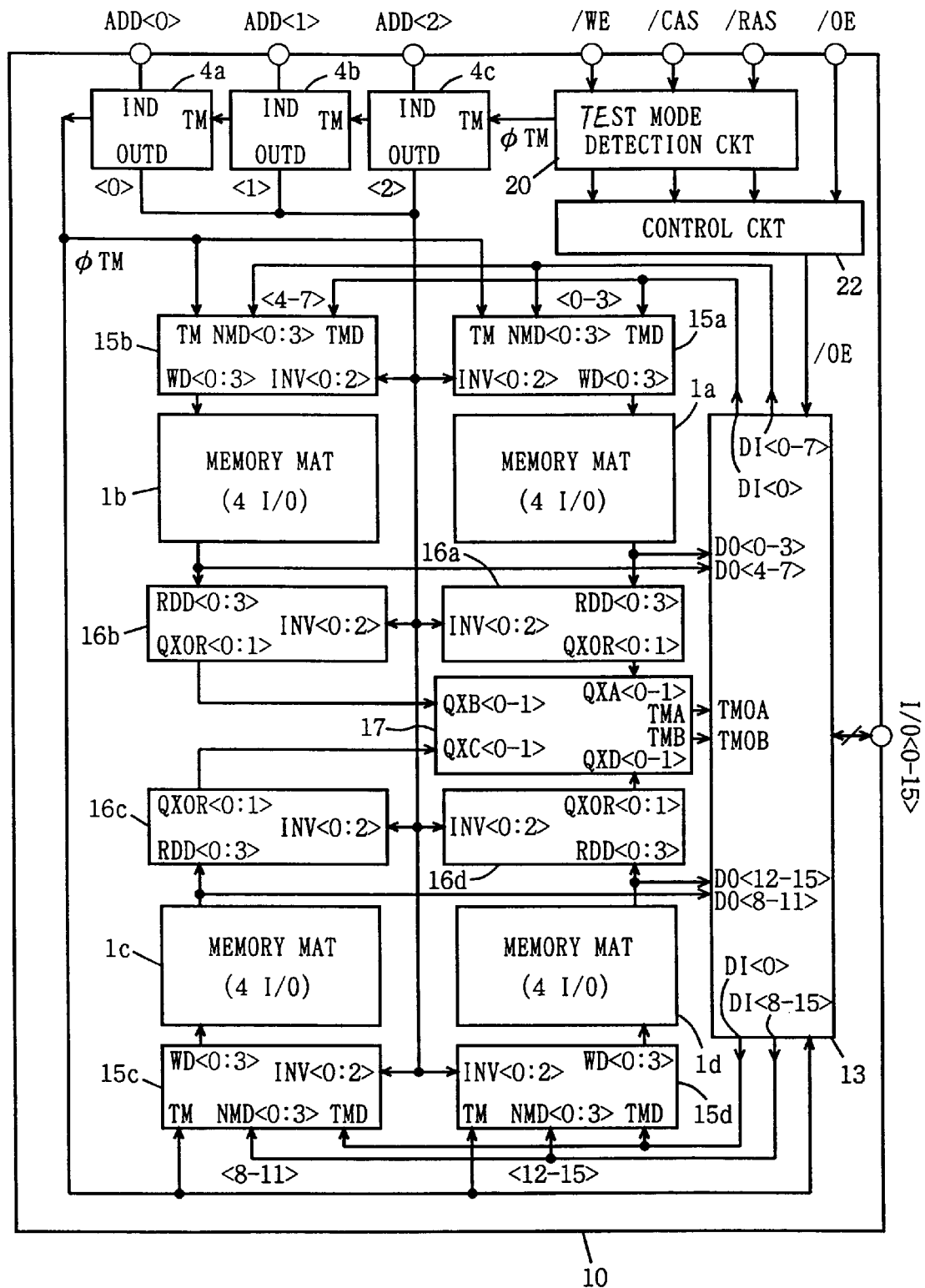
FIG. 2 is a diagram schematically showing the configuration of a main part of a semiconductor memory device according to a first embodiment of the invention.

FIG. 2 is a diagram schematically showing the overall configuration of a semiconductor memory device according to a first embodiment of the invention. In FIG. 2, there are provided 16 data input/output terminals, and a configuration for inputting/outputting 16-bit data I/O<0–15> is shown by way of illustration (in which a node and its data are represented by the same reference character). In FIG. 2, semiconductor memory device 10 includes memory mats 1a, 1b, 1c and 1d each having a plurality of memory cells and provided corresponding to 4-bit data input/output terminals. Memory mat 1a is provided corresponding to input/output data I/O<0–3>, memory mat 1b to input/output data I/O<4–7>, memory mat 1c to input/output data I/O<8–11>, and memory mat 1d to input/output data I/O<12–15>. These memory mats 1a to 1d have the same configuration, and each includes a cell selecting circuit, in other words an X decoder and a Y decoder shown in FIG. 1.

The semiconductor memory device further includes writing circuits 15a to 15d provided corresponding to memory mats 1a to 1d, respectively for writing data received from a data input/output circuit 13 into a selected memory cell in a corresponding memory mat in data writing, and reading circuits 16a to 16d provided corresponding to memory mats 1a to 1c, respectively for changing the logic levels of corresponding memory cell data and detecting the coincidence/non-coincidence of logics.

Writing circuits 15a to 15d have the same configuration and have a test data input node TMD receiving 1-bit data DI<0> commonly applied from input/output circuit 13 in the test mode, a normal data input node NMD<0:3> receiving corresponding 4-bit data from the input/output circuit, writing data output nodes WD<0:3> outputting 4-bit writing data, mode setting data input nodes INV<0:2> for inputting data indicating the changed states of the logic of writing test data in the test mode, and a test mode activation signal input node TM receiving a test mode activation signal φTM.

These writing circuits 15a to 15d each transmit data at normal data input nodes NMD<0:3> to writing data output nodes WD<0:3> in the normal operation mode, and write data received from input/output circuit 13 to selected memory cells in a corresponding memory mat. In the test mode, activated by test mode activation signal φTM, writing circuits 15a to 15d each select 1-bit data received from input/output circuit 13, change the logic level of data in accordance with data received at its changing mode setting input nodes, and transmit the result to writing data output node WD<0:3>.

Therefore, in the test mode, 1-bit test data DI<0> is commonly applied from the input/output circuit to writing circuits 15a to 15d at their test mode data input nodes TMD, and the data has its logic level changed in each of writing circuits 15a to 15d for writing to corresponding 4-bit memory cells. The changing of logic level, as will be described in detail, is set independently for each bit of 4 bit data when 4 bit data is produced from 1-bit data.

As to a crosstalk at a data input/output bus, crosstalk at data buses provided corresponding to memory mats 1a to 1d causes a significant problem. Thus, for each memory mat, the logic levels of 4-bit data are independently changed according to changing mode setting data applied at input nodes INV<0:2>.

In order to change the writing test data, there are provided a test mode detection circuit 20 for detecting a test mode being specified based on the states of an externally applied write enable signal /WE, a column address strobe signal /CAS, and a row address strobe signal /RAS, and mode setting register circuits 4a, 4b and 4c for latching address signals ADD<0>, ADD<1>, and ADD<2> in accordance with test mode activation signal φTM from test mode detection circuit 20. Mode setting register circuits 4a to 4c each receive a corresponding address signal at input node IND, receive test mode activation signal φTM at input node TM and output the latched data to output node OUTD. Test mode detection circuit 20 pulls test mode activation signal φTM to an active state when a so-called WCBR (/WE, /CAS before /RAS) condition is satisfied. Mode setting register circuits 4a to 4c attain a latch state in response to the activation of test mode activation signal φTM, and latch address signals ADD<0> to ADD<2> applied currently.

The output signals of mode setting register circuits 4a to 4c are applied to the mode setting data input nodes INV<0:2> of writing circuits 15a to 15b commonly. Thus in memory mats 1a to 1d, the same logic changing operation is conducted to 4-bit data. Herein, 3-bit mode setting data INV<0:2> is used, because the remaining 1-bit data is not subjected to logic changing (because external test data may be appropriately adjusted.)

Data stored in mode setting register circuits 4a to 4c represent whether or not to invert the logic levels of each of 3-bits among the 4-bit data in each of memory mat 1a to 1d. Thus, an arbitrary data pattern can be produced for the 4-bit data.

The semiconductor memory device further includes local determination circuits 16a to 16d provided corresponding to memory mats 1a to 1d and receiving 4-bit memory cell data from a corresponding memory mat, changing the logics of read out data according to changing mode setting data, determining the coincidence/non-coincidence of the logics, and outputting a signal representing the result of determination, and a global determination circuit 17 receiving test result data outputs from these local determination circuits 16a to 16d and determining the coincidence/non-coincidence of these logic levels.

Local determination circuits 16a to 16d each include nodes INV<0:2> receiving mode setting data from mode setting register circuits 4a to 4c respectively, nodes RDD<0:3> receiving 4-bit data read out from a corresponding memory mat, and a 2-bit signal output node QXOR<0:1> representing the result of determining the coincidence/non-coincidence of logic levels.

Local determination circuits 16a to 16d each change the logics of read out memory cell data, then take a logical AND and a NOR thereof, and output the resultant signals.

Global determination circuit 17 includes a logical determination portion which receives the output signals of these local determination circuits 16a to 16d, determines the coincidence/non-coincidence of their logic levels, and outputs a signal indicating the logic in coincidence when a coincidence is found, and a logic determination portion which outputs a signal simply indicating the coincidence/non-coincidence of the logic levels. The result of determination by global determination portion 17 is applied to the nodes TMOA and TMOB of input/output circuit 13 from nodes TMA and TMB.

Input/output circuit 13 outputs the output signal of global determination circuit 17 to the 2-bit data input/output nodes among the 16-bit input/output nodes when test mode activation signal φTM is activated, and selects data DI<0> applied to a particular data input/output node as test data.

In the normal operation mode, input/output circuit 13 receives externally applied 16-bit data I/O<0–15>, and transmits corresponding data on a 4-bit basis to each memory mat 1a to 1d through internal nodes DI<0–7> and DI<8–15>. Input/output circuit 13 receives data read out from memory mats 1a to 1d through nodes DO<0–3>, DO<4–7>, DO<8–11> and DO<12–15>, respectively, and outputs these pieces of data according to an output enable signal /OE applied through a control circuit 22.

Control circuit 22 receives write enable signal /WE, column address strobe signal /CAS and row address strobe signal /RAS and produces various internal control signals necessary for internal operation. Now, the internal operation will be briefly described.

Figure 3:
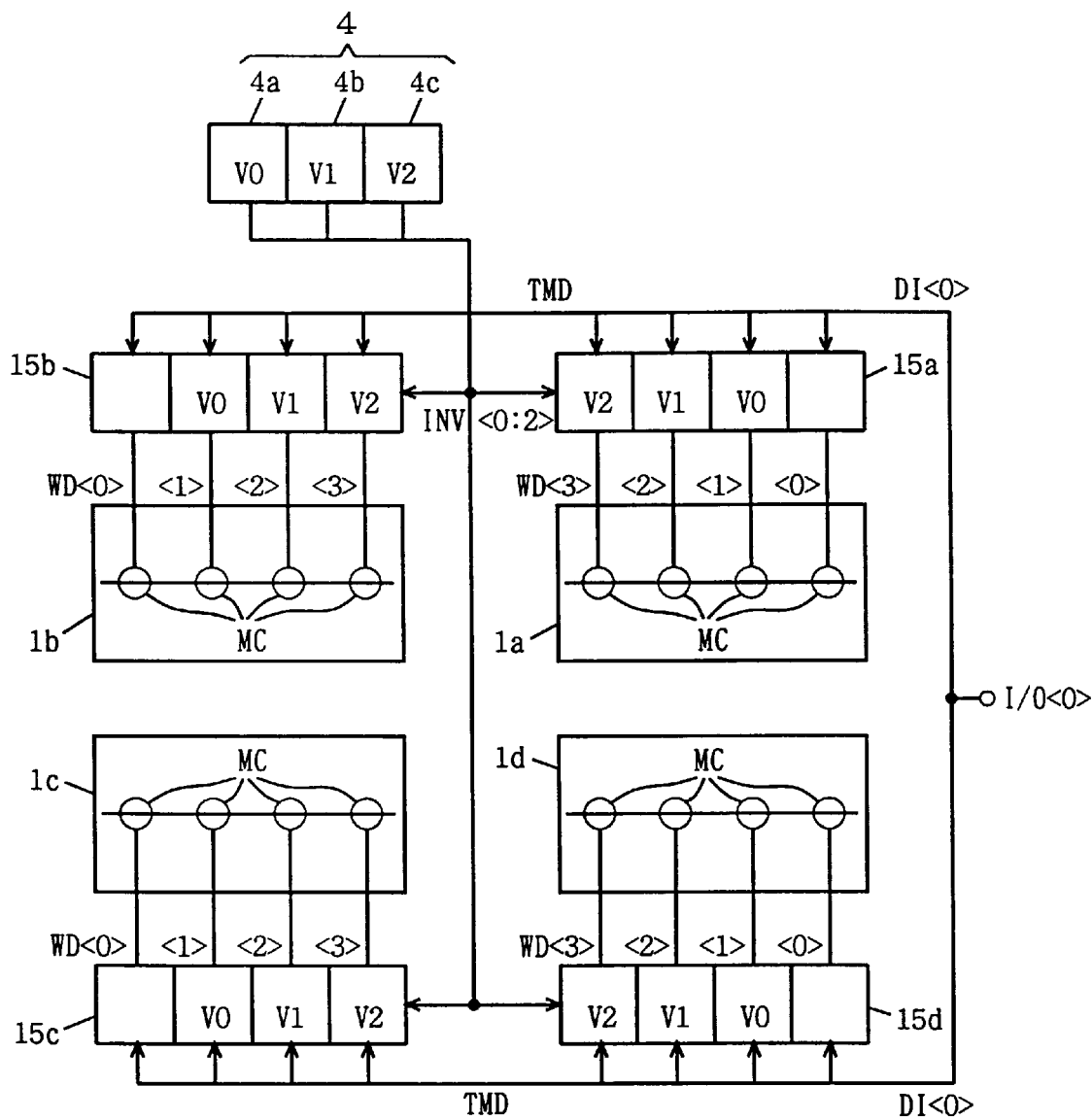
FIG. 3 is a diagram schematically showing the configuration of a portion related to transfer of writing data during testing operation in the semiconductor memory device according to the first embodiment of the invention.

FIG. 3 is a diagram schematically showing the flow of writing test data when a test mode activation signal is activated. In FIG. 3, mode setting register circuits 4a to 4c store data V0 to V2 indicating whether or not to perform logic inversion. These pieces of data V0 to V2 are applied to the nodes INV<0:2> of writing circuits 15a to 15d. Writing circuits 15a to 15d commonly receive internal writing data DI<0> of input/output data I/O<0> selected by input/output circuit 13 (see FIG. 2). Writing circuits 15a to 15d each output writing data DI<0> as writing data WD<0>, and further produce 3 bits of writing data WD<1> to <3> from writing data DI<0> and mode setting data V0 to V2. Mode setting data V0 to V2 are each used to set whether or not to invert the logic of internal writing data DI<0>.

Writing data WD<0:3> (=WD<0>–<3>) from writing circuits 15a to 15d are written in parallel to memory cells MC of 4 bits simultaneously selected in corresponding memory mats 1a to 1d.

Mode setting data V0, V1 and V2 are provided by different address signals ADD<0> to ADD<2>. Thus, to each of writing data WD<1> to <3>, whether to output the same data or logic-inverted data as internal writing data DI<0> can be set independently from each other. Thus, in memory mats 1a to 1d, 4-bit test data having a prescribed pattern can be produced based on 1-bit internal writing data DI<0> for writing.

Figure 4:
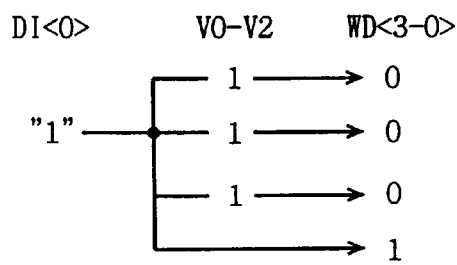
FIG. 4 is a diagram showing an example of a writing data logic setting in the semiconductor memory device according to the first embodiment of the invention.

FIG. 4 shows a specific example of how writing data is produced. In FIG. 4, internal writing data D1<0> is logic "1" by way of illustration. Assume that mode setting data V0 to V2 stored in mode setting register circuits 4a to 4c are all set to logic "1". If the logic "1" indicates logic inversion, logic "0" data is produced as writing data WD<3>–<1>. Therefore, 4-bit writing data "0001" is produced from 1-bit internal writing data "1". By setting mode setting data V0 to V2 to suitable values, 4-bit internal writing data having an appropriate pattern can be produced.

Figure 5:
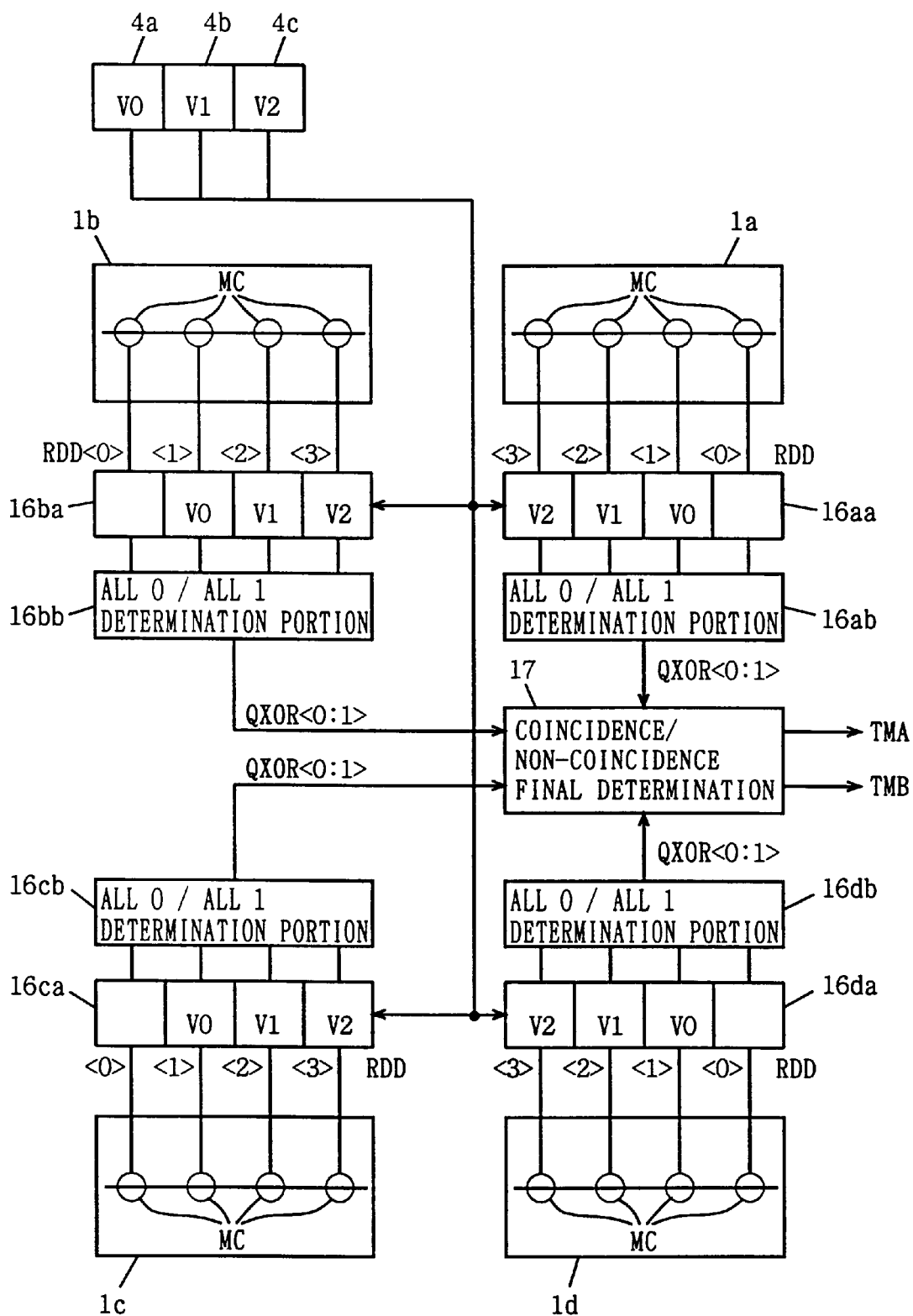
FIG. 5 is a diagram schematically showing the configuration of a test data reading portion in the semiconductor memory device according to the first embodiment of the invention.

FIG. 5 is a diagram schematically showing the flow of reading data in the test mode. In FIG. 5, local determination circuits 16a to 16d are each divided into reading data logic changing portions 16aa to 16da, and all 0 / all 1 determination portions 16ab to 16db for determining if the logics of the output signals of logic changing portions 16aa to 16ba are all 0s or all 1s. The results of determination by these all 0 / all 1 determination portions 16ab to 16da are applied to global determination portion 17, and coincidence/non-coincidence is eventually determined.

In memory mats 1a to 1d, memory cells MC of 4 bits are selected, and the data of these selected memory cells MC are applied to logic changing portions 16aa to 16da. These logic changing portions 16aa to 16da receive mode setting data V0 to V2 from mode setting register circuits 4a to 4c. Logic changing portions 16aa to 16da each change the logics of data of corresponding memory cells of 4 bits according to mode setting data V0 to V2, and supply the result to all 0 / all 1 determination portions 16ab to 16db. Mode setting data V0 to V2 supplied to logic changing portions 16aa to 16da are the same data as those at the time of test data writing, and therefore the read out data are subjected to the same logic inversion as that at the time of writing. Thus logic-inverted data has once again its logic inverted at the time of reading and becomes equal to the original data.

In all 0 / all 1 determination portions 16ab to 16db determine if the logic levels of data from corresponding logic level changing portions 16aa to 16da are all "0s" or "1s", and output signals QXOR<0:1> representing the result of determination. Global determination portion 17 determines the coincidence/non-coincidence of the determination results applied from all 0 / all 1 determination portions 16ab to 16db for each of the all 0 determination result and all 1 determination result, outputs a signal indicating a coincidence if a coincidence is found, and a signal indicating a non-coincidence if no coincidence is found. If a coincidence is found, data representing the logic in coincidence is further output.

Global determination portion 17 therefore only makes binary determination, and the data input/output terminal (not shown in FIG. 5) is not driven to a high impedance state.

Figure 6:
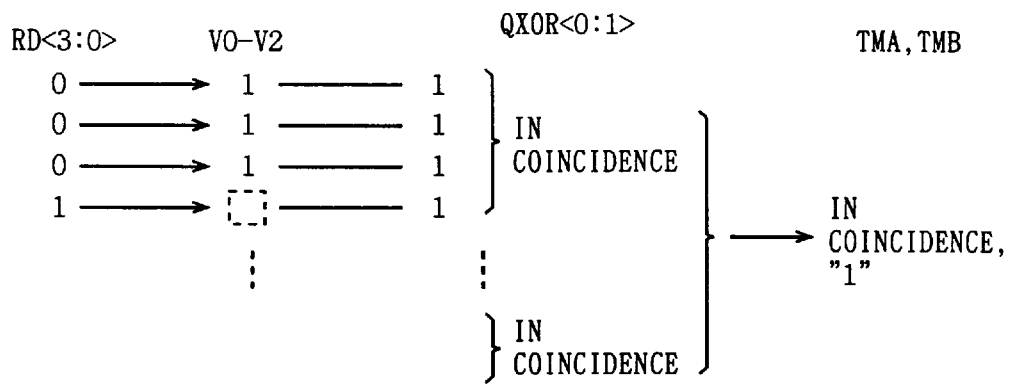
FIG. 6 is a diagram showing the flow of signals at the time of reading test data in the semiconductor memory device according to the first embodiment of the invention.

FIG. 6 shows an example of testing operation. In FIG. 6, as is with data writing operation, "0001" is output from each of memory mats 1a to 1d as 4-bit reading data RD<3:0>. Since mode setting data V0–V2 are all "1s", the logics of reading data "0" in the output signals of reading data logic changing portions 16aa to 16db are all inverted into "1". In all 0 / all 1 determination portions 16ab to 16db, signal QXOR<0:1> representing logic "1" being in coincidence is output.

If the results of determination from all these all 0 / all 1 determination portions 16ab to 16db indicate the logic "1" (or "0") in coincidence, global determination portion 17 outputs signals representing the coincidence and the logic "1" (or "0"). If no coincidence is found, a signal representing the non-coincidence and a signal representing a particular logic level are output. Global determination portion 17 performs binary determination, rather than ternary determination having an output high impedance state. Therefore, a high impedance state is not necessary, which reduces the period of test cycle, and therefore high speed testing can be implemented.

During reading, the same logic change as that in writing is performed, the original data is restored, and therefore the presence/absence of a defect in memory cells can be identified simply by accurately determining the coincidence/ non-coincidence of the logics of memory cell data even if data of an arbitrary pattern is written during writing.

Now, the configuration of each element will be specifically described.

Figure 7A:
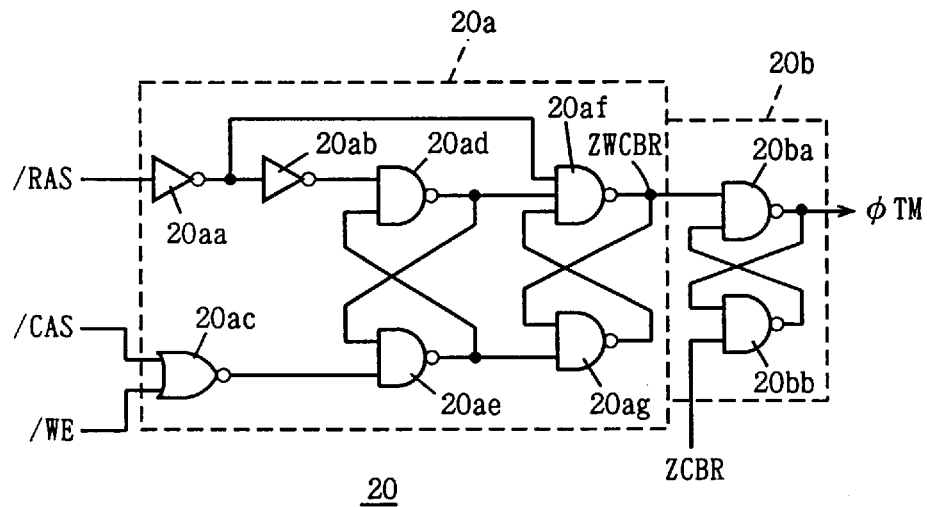
FIG. 7A is a diagram showing an example of the configuration of a test mode detection circuit shown in FIG. 2.

FIG. 7A is a diagram showing a specific example of the configuration of a test mode detection circuit 20. In FIG. 7A, test mode detection circuit 20 includes a WCBR detection circuit 20a to detect the WCBR condition, and a set/reset flip-flop 20b which is set if the WBCR condition is satisfied and reset if a CBR ( /CAS before /RAS) condition is satisfied. In the CBR condition, column address strobe signal /CAS falls, and then row address strobe signal /RAS falls.

WCBR detection circuit 20a includes an inverter circuit 20aa receiving row address strobe signal /RAS, an inverter circuit 20ab receiving the output signal of inverter circuit 20aa, an NOR circuit 20ac receiving column address strobe signal /CAS and write enable signal /WE, an NAND circuit 20ad receiving the output signal of inverter circuit 20ab at its one input, and an NAND circuit 20ae receiving the output signal of NOR circuit 20ac at its one input. The output signal of NAND circuit 20ad is applied to the other input of NAND circuit 20ae, and the output signal of NAND circuit 20ae is applied to the other input of NAND circuit 20ad.

WCBR detection circuit 20a further includes a 3-input NAND circuit 20af receiving the output signals of inverter circuit 20aa, NAND circuit 20ad, and an NAND circuit 20ag. NAND circuit 20ag receives the output signal of NAND circuit 20ae and the output signal of NAND circuit 20af.

Figure 7B:
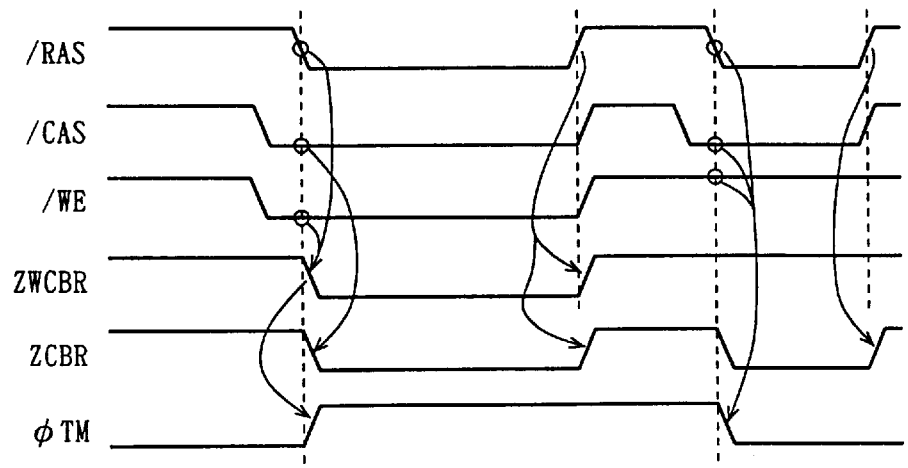
FIG. 7B is a waveform chart representing the operation of the circuit in FIG. 7A.

Set/reset flip-flop 20b includes an NAND circuit 20ba receiving the output signal of NAND circuit 20af at its one input, and an NAND circuit 20bb receiving a CBR detection signal ZCBR and the output signal of NAND circuit 20ba. The output signal of NAND circuit 20bb is applied to the other input of NAND circuit 20ba. Test mode activation signal φTM is output from NAND circuit 20ba. Now, the operation of test mode detection circuit 20b shown in FIG. 7A will be described by referring to the signal waveform chart in FIG. 7B.

When row address strobe signal /RAS is at an H level, column address strobe signal /CAS and write enable signal /WE are both set to an L level. The output signal of NOR circuit 20ac attains an H level. In this state, the output signal of inverter circuit 20aa is at an L level, and WCBR detection signal ZWCBR output from NAND circuit 20af changes its level to an H level. The output signal of inverter circuit 20ab is at an H level, and the states of the output signals of NAND circuits 20ad and 20ae do not change.

When row address strobe signal /RAS is pulled to an L level, the output signal of inverter circuit 20aa attains an H level, the output signal of inverter circuit 20ab attains an L level, and the output signal of NAND circuit 20ad attains an H level. The output signal of NOR circuit 20ac is at an H level, and the output signal of NAND circuit 20ae attains an L level accordingly. Thus, the output signal of NAND circuit 20ag attains an H level, the signals at the three inputs of NAND circuit 20af all attain an H level, and WCBR detection signal ZWCBR attains an L level. When WCBR detection signal ZWCBR falls, test mode activation signal φTM output from NAND circuit 20ba attains an H level active state. Thus, the test mode is specified.

When row address strobe signal /RAS is pulled to an H level, the output signal of inverter circuit 20aa attains an L level, and WCBR detection signal ZWCBR output from NAND circuit 20af attains an H level. Thus, set/reset flip-flop 20b maintains its set state, causing test mode activation signal φTM to keep an active state, and a series of testing operations including selecting a memory cell and writing/ reading out test data are performed.

At the completion of a testing operation, column address strobe signal /CAS is pulled to an L level before row address strobe signal /RAS. Write enable signal /WE holds its H level. In this state, in WCBR detection circuit 20a, the output signal of NOR circuit 20ac is at an L level, and the output signal of NAND circuit 20ae is at ah H level. In this state, when row address strobe signal /RAS is pulled to an L level, the output signal of NAND circuit 20ad attains an H level, and therefore the latching state of the flip-flop formed of NAND circuits 20af and 20ag is not changed. WCBR detection signal ZWCBR therefore maintains its H level reset state.

Meanwhile, under the CBR condition, when CBR detection signal ZCBR is pulled to an L level, the output signal of NAND circuit 20bb attains an H level, both inputs of NAND circuit 20ba attain an H level, and test mode activation signal φTM attains an L level. Thus, the test mode is completed. When row address strobe signal /RAS is pulled to an H level, CBR detection signal ZCBR attains an H level.

As a circuit for producing CBR detection signal ZCBR, a configuration identical to WCBR detection circuit 20a may be employed. In place of the output signal of NOR circuit 20ac, column address strobe signal /CAS is used.

Figure 8A:
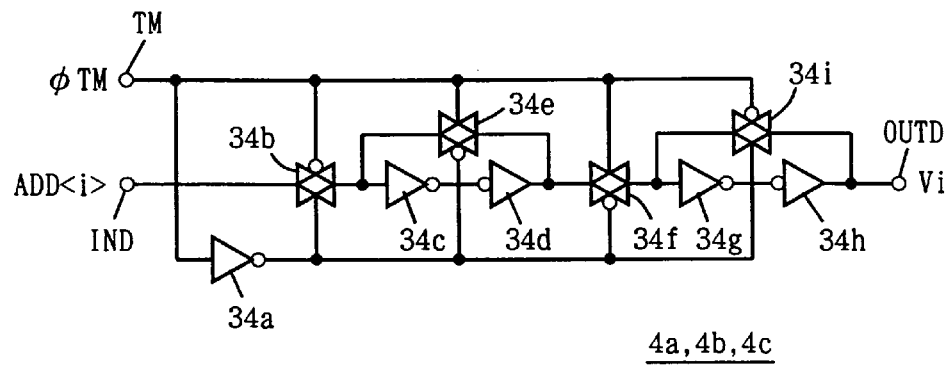
FIG. 8A is a diagram showing a specific example of the configuration of a mode setting register circuit shown in FIG. 2.
Figure 8B:
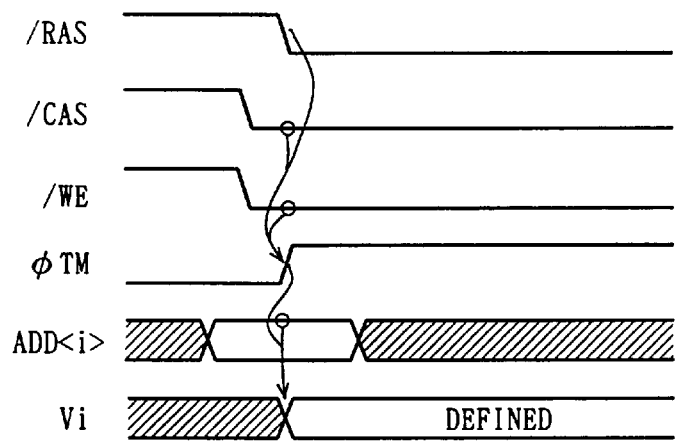
FIG. 8B is a waveform chart representing the operation of the register circuit shown in FIG. 8A.

FIG. 8A is a diagram showing an example of the configurations of mode setting register circuits 4a to 4c shown in FIG. 2. In FIG. 8A, since mode setting register circuits 4a to 4c have the same configuration, one mode setting register circuit is shown by way of illustration. In FIG. 8A, mode setting register circuits 4a to 4c each include an inverter circuit 34a receiving test mode activation signal φTM applied to a node TM, a transmission gate 34b which is rendered nonconductive in response to an activation (H level) of test mode activation signal φTM and is rendered conductive in response to an inactivation (L level) of test mode activation signal φTM and passes therethrough a corresponding address signal ADD<i> applied to a node IND, an inverter circuit 34c receiving the output signal of transmission gate 34b, an inverter circuit 34d receiving the output signal of inverter circuit 34c, a transmission gate 34e which conducts in a complementary manner with transmission gate 34b in response to test mode activation signal φTM and transmits the output signal of inverter circuit 34d to the input portion of inverter circuit 34c when turned on, a transmission gate 34f which conducts in a complementary manner with transmission gate 34b in response to test mode activation signal φTM and selectively passes therethrough the output signal of inverter circuit 34a, an inverter circuit 34g receiving the signal transmitted by transmission gate 34f, an inverter circuit 34h receiving the output signal of inverter circuit 34g, and a transmission gate 34i which conducts in phase with transmission gate 34b in response to test mode activation signal φTM and connects the input of inverter circuit 34e and the output of inverter circuit 34h. Now, the operations of mode setting register circuits 4a to 4c as shown in FIG. 8A will be described with reference to the signal waveform chart in FIG. 8B.

When test mode activation signal φTM is at an L level, the output signal of inverter circuit 34a is at an H level, transmission gates 34b and 34i are in a conductive state, while transmission gate 34e and 34f are in a nonconductive state. In this state, as mode setting data Vi, data set in the previous cycle is output.

Column address strobe signal /CAS and write enable signal /WE are lowered prior to row address strobe signal /RAS, and address signal ADD<i> is set to a prescribed value. In this state, address signal ADD<i> is applied to inverter circuit 34c through transmission gate 34b, and the output signal of inverter circuit 34d becomes a signal having the same logic as that of address signal ADD<i>. When row address strobe signal /RAS is pulled to an L level, test mode activation signal φTM attains an H level, transmission gates 34b and 34i are rendered nonconductive, while transmission gates 34e and 34f are rendered conductive.

Inverter circuits 34c and 34d and transmission gate 34e form a latch circuit, an address signal at a falling of row address strobe signal /RAS is latched, and the latched signal is transmitted to inverter circuit 34g through transmission gate 34f. Inverter circuits 34g and 34h and transmission gate 34i do not form a latch circuit, and the state of mode setting data Vi changes at a high speed into the logic state of the signal applied through transmission gate 34f. Mode setting data Vi does not change, because the mode setting register circuit is in a latching state as long as test mode activation signal φTM is at an H level. Thus, during the testing operation, test data of a prescribed pattern may be written in.

Figure 9:
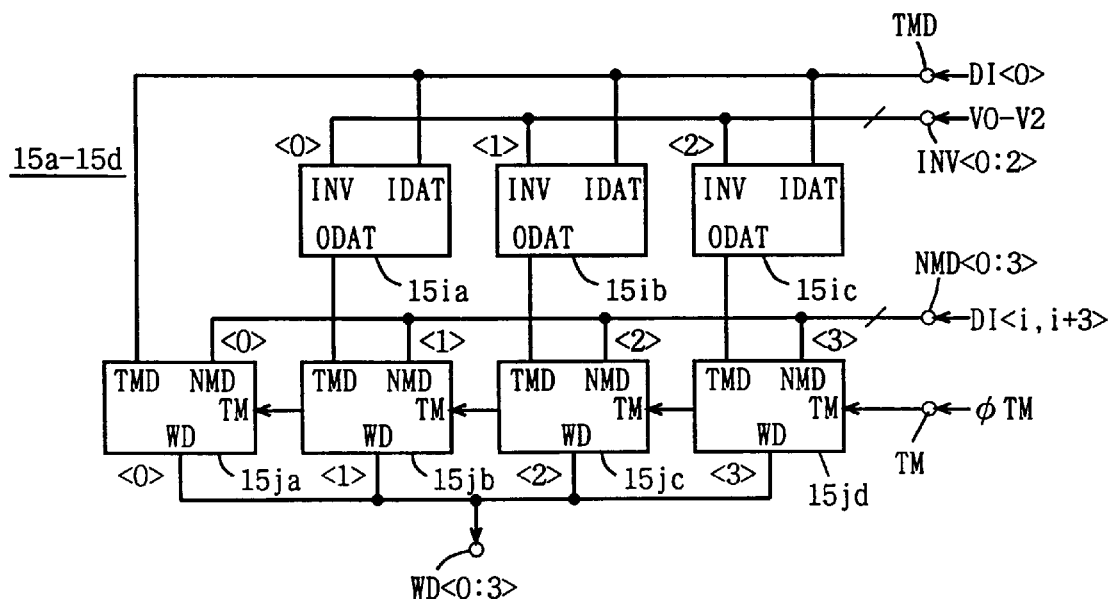
FIG. 9 is a diagram schematically showing the configuration of a writing circuit in FIG. 2.

FIG. 9 is a diagram schematically showing the configurations of writing circuits 15a to 15d. Since these writing circuits 15a to 15d have the same configuration, and therefore FIG. 9 shows the configuration of only one writing circuit by way of illustration. In FIG. 9, writing circuits 15a to 15d each include logic setting circuits 15ia, 15ib, and 15ic which selectively invert the logic of test data DI<0> applied to node TMD based on mode setting data V0 to V2 applied to nodes INV<0:2>, a selecting circuit 15ja which selects one of test data DI<0> applied to node TMD and data DI<i> applied in a normal operation mode, and selecting circuits 15ab to 15ad provided corresponding to logic setting circuits 15ia to 15ic to selectively pass therethrough one of the output signal received from the node ODAT of a corresponding logic setting circuit and DI<i+1–i+3> applied in the normal operation mode in response to test mode activation signal φTM. Internal writing data is produced from the nodes WD of these selecting circuits 15ja to 15jd and output from nodes WD<0:3>.

Figure 10:
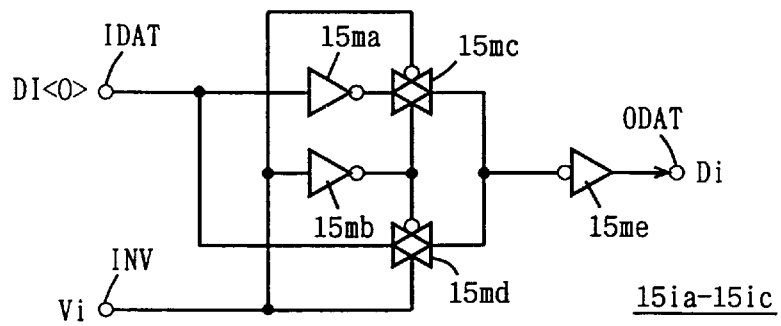
FIG. 10 is a diagram showing a specific example of the configuration of a test data logic changing portion shown in FIG. 9.

FIG. 10 is a diagram showing an example of the configuration of each of logic setting circuits 15ia–15ic shown in FIG. 9. Since these logic setting circuits 15ia to 15ic have the same configuration, the configuration of only one logic setting circuit is shown in FIG. 10 by way of illustration.

In FIG. 10, logic setting circuits 15ia to 15ic each include an inverter 15ma receiving data DI<0> applied to a node IDAT, an inverter 15mb receiving mode setting data Vi applied to a node INV, a transmission gate 15mc which passes therethrough the output signal of inverter 15ma based on mode setting data Vi and the output signal of inverter 15mb, a transmission gate 15md which conducts in a complementary manner to transmission gate 15mc based on mode setting data Vi and the output signal of inverter 15mb and passes therethrough data DI<0> from node IDAT, and an inverter 15me which receives a signal applied from one of transmission gates 15mc and 15md and outputs logic setting data Di to a node ODAT.

When mode setting data Vi is at an H level ("1"), transmission gate 15mc is in a non-conductive state, transmission gate 15md is in a conductive state, and data DI<0> from node IDAT is selected and applied to inverter 15me. Data Di therefore has a logic opposite to DI<0>.

Meanwhile, when mode setting data Vi is at an L level ("0"), transmission gate 15mc is in a conductive state, transmission gate 15md is in a non-conductive state, and the output signal of inverter 15ma is selected and applied to inverter 15me. Data Di therefore has the same logic as input data DI<0>.

Figure 11:
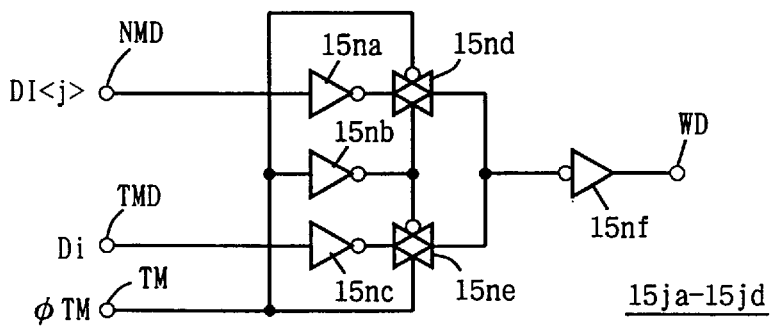
FIG. 11 is a diagram showing a specific example of the configuration of a data writing circuit shown in FIG. 9.

FIG. 11 is a diagram showing an example of the configuration of each of selecting circuits 15ja to 15jd shown in FIG. 9. In FIG. 11, these selecting circuits 15ja and 15jd have the same configuration, and the configuration of only one selecting circuit is shown by way of illustration.

In FIG. 11, selecting circuits 15ja to 15jd each include an inverter 15na receiving data DI<j> applied to a node NMD, an inverter 15nc receiving data Di applied to a node TMD, an inverter 15nb receiving test mode activation signal φTM applied to a node TM, a transmission gate 15nd which is rendered conductive based on test mode activation signal φTM and the output signal of inverter 15nb and transmits the output signal of inverter 15na, a transmission gate 15ne which is rendered conductive in a complementary manner to transmission gate 15nd based on test mode activation signal φTM and the output signal of inverter 15nb and transmits the output signal of inverter 15nc, and an inverter 15nf receiving data applied from one of transmission gates 15nd and 15ne. Wiring data is supplied to node WD from inverter 15nf.

Data DI<j> applied to node NMD is data applied to a corresponding data input/output node. Data Di applied to node TMD is either writing test DI<0> (in the case of selector 15aa) or the output signal of a corresponding one of logic setting circuit 15ia to 15ic.

In the configuration of each of selecting circuits 15aa to 15ad in FIG. 11, when test mode activation signal φTM is in an inactive state, transmission gate 15nd is rendered conductive, transmission gate 15ne is rendered nonconductive, and data DI<j> applied to node NMD is transmitted to node WD through inverters 15na and 15nf. Therefore, when test mode activation signal φTM is in an inactive state, in other words in the normal operation mode, data applied from a corresponding data input/output terminal is written in a corresponding memory cell.

When test mode activation signal φTM is activated, transmission gate 15ne is rendered conductive, and transmission gate 15nd is rendered nonconductive. In this state, data Di or DI<0> applied to node TMD is transmitted to node WD through inverters 15nc and 15nf.

In the testing mode, data having its logic set according to mode setting data is selected and written in a corresponding memory cell.

Figure 12:
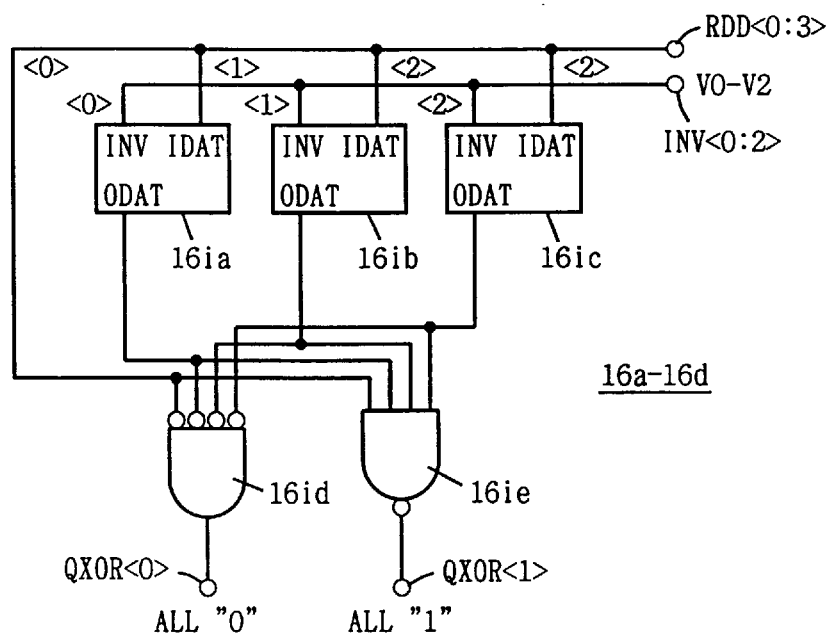
FIG. 12 is a diagram schematically showing the configuration of a local determination circuit shown in FIG. 2.

FIG. 12 is a diagram schematically showing the configuration of each of local determination circuits 16a to 16d in FIG. 2. In FIG. 12, since these local determination circuits 16a to 16d have the same configuration, the configuration of only one local determination circuit is shown by way of illustration.

In FIG. 12, local determination circuits 16a to 16d each include reading logic setting circuits 16ia to 16ic provided corresponding to the data of memory cells having their logics set by corresponding writing circuits and performing the same logic setting according to mode setting data V0 to V2, an NOR circuit 16id receiving the output signals of these reading logic setting circuits and the remaining one bit of reading data, and an NAND circuit 16ie which similarly receives the output signals of reading logic setting circuits 16ia to 16ic and the remaining one bit of reading data.

Reading logic setting circuits 16ia to 16ic each have the same configuration as logic setting circuits 15ia to 15ic at the time of writing shown in FIG. 10, set corresponding reading data supplied to node IDAT to a logic based on mode setting data Vi (any of V0 to V2) supplied at node INV, and output the logic-set data to node ODAT. Logic setting circuits 15ia to 15ic and reading logic setting circuits 16ia to 16ic receive the same mode setting data if they are provided for the same memory cells. Therefore, logic-inverted data which is logically inverted in writing test data is read out to have its logic again inverted by the reading logic setting circuit. Thus, data having the same logic as the original writing data is output.

NOR circuit 16id outputs an H level ("1") signal to node QXOR<0> when received signals are all at an L level ("0"). NAND circuit 16ie outputs an L level ("0") signal to node QXOR<1> if received signals are all at an H level ("1"). As a result, a signal representing a determination result on whether all the read out data is 0 is output to node QXOR<0>, and a signal representing a determination result on whether data read out from memory cells are all "1" is output to node QXOR<1>.

Figure 13:
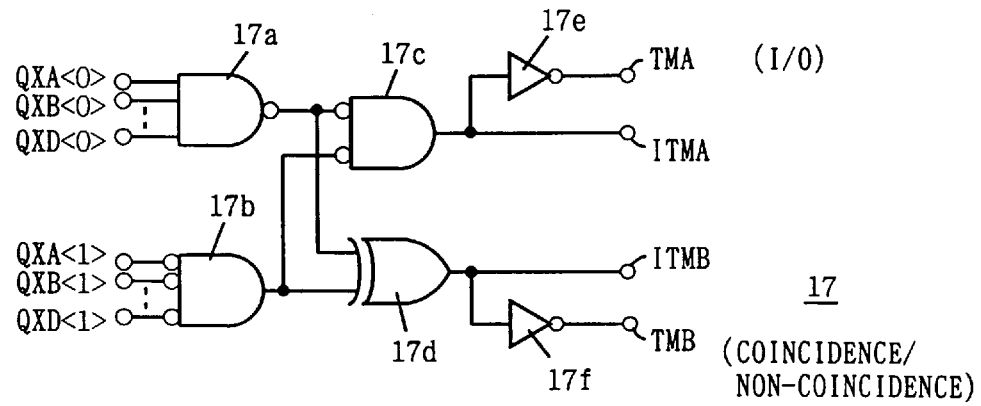
FIG. 13 is a diagram showing the configuration of an example of a global determination circuit shown in FIG. 2.

FIG. 13 is a diagram showing a specific example of the configuration of global determination circuit 17 shown in FIG. 2. As shown in FIG. 13, global determination circuit 17 includes an NAND circuit 17a receiving all "0" indication signals applied from local determination circuits 16a to 16d through nodes QXA<0> to QXD<0>, an NOR circuit 17b receiving all "1" indication signals applied from local determination circuits 16a to 16d through nodes QXA<1> to QXD<1>, an NOR circuit 17c receiving the output signal of NAND circuit 17a and the output signal of NOR circuit 17b, an EXOR circuit 17d receiving the output signal of NAND circuit 17a and the output signal of NOR circuit 17b, an inverter circuit 17e receiving the output signal of NOR circuit 17c, and an inverter circuit 17f receiving the output signal of EXOR circuit 17a.

A test result indication signal is applied from inverter 17e to node TMA, and a test result indication signal complementary to the signal at node TMA is output to node ITMA from NOR circuit 17c. A second test result indication signal is output from inverter circuit 17f to node TMB, and a signal complementary to the second test result indication signal is output to node ITMB from EXOR circuit 17d. Now, the operation will be described.

(a) If a test memory cell is normal:
(i) when data read out from selected memory cells all have a logic "0", signals applied to nodes QXA<0> to QXD<0> are all "1", and signals applied to nodes QXA<1> to QXD<1> are all "1". Therefore, the logic of the output signal of NAND circuit 17a becomes "0", while the output signal of NOR circuit 17b becomes "0". The output signal of NOR circuit 17c becomes "1" accordingly, and the output signal of EXOR circuit 17d has logic "0". The signal of node TMA has logic "0" and the signal of node TMB has logic "1".

(ii) When all memory cell data have a logic "1", signals applied to nodes QXA<1> to QXD<1> from local determination circuits 16a to 16d all have a logic "0", and signals applied to nodes QXA<0> to QXD<0> all have a logic "0". Therefore, the output signal of NAND circuit 17a has a logic "1", and the output signal of NOR circuit 17b has a logic "1". The output signal of NOR circuit 17c has a logic "0" accordingly, and the output signal of EXOR circuit 17b has a logic "0". Signals applied to node TMA have a logic "1" and signals applied to node TMB have a logic "1".

(c) If a defective memory cell is present:
If a defective memory cell is present, the all "0" indication signal has a logic "0", and the all "1" indication signal has a logic "1" in the local determination circuit in FIG. 12. If memory cells of 4 bits are all defective in one memory array, the logics of read out data are in coincidence for example like 0→(0101)→(1111). Among signals applied to nodes QXA<0> to QXD<0>, a signal corresponding to the mat having all the four bits of defective cells has a logic "0", while among signals applied to nodes QXA<1> to QXD<1>, a signal corresponding to the defective mat has a logic "0". The output signal of NOR circuit 17c has logic "0" accordingly, while the output signal of EXOR circuit 17d has a logic "0" if all the memory cells in the entire mats are defective, and otherwise has "1". Therefore, the signal at node TMA has logic "1", and the signal at node TMB has a logic "1" or "0".

When signals at nodes TMA and TMB both have a logic "1", output data I/O<0>=I/O<1>=1, which indicates that the logics of all bits are in coincidence based on I/O<1>=1, and the all bit-defective state is determined based on the non-coincidence with writing test data "0" based on I/O<0>=1. If the signal at node TMB is "0", I/O<1>=0 holds, which indicates a defect.

More specifically, if all the logics of data read out from simultaneously selected memory cells are in coincidence, a signal having a logic corresponding to the logic in coincidence is output to node TMA, and otherwise a signal having a logic "1" is output. A signal representing the coincidence/non-coincidence of logics of data read out from the simultaneously selected memory cells is output to node TMB concurrently.

Signals at nodes TMA and TMB are output externally through an input/output circuit which will be described. Since there is no high impedance state, in other words binary determination is made in each case, and therefore the test cycle period can be reduced.

Note that in this testing operation, logic "0" data is written in all the bits, and if logic "1" data is read out (unless a logic inverting processing is performed), node TMB outputs a signal representing the logic "1" in coincidence, and node TMA outputs a signal representing the logic "1" in coincidence. Therefore, if the coincidence is indicated, comparison of the logic level of the signal at node TMA with the logic level of the written test data readily permits identification of whether or not the simultaneously selected memory cells are all defective. Memory cell defects of any patterns can be accurately detected as a result.

Figure 14:
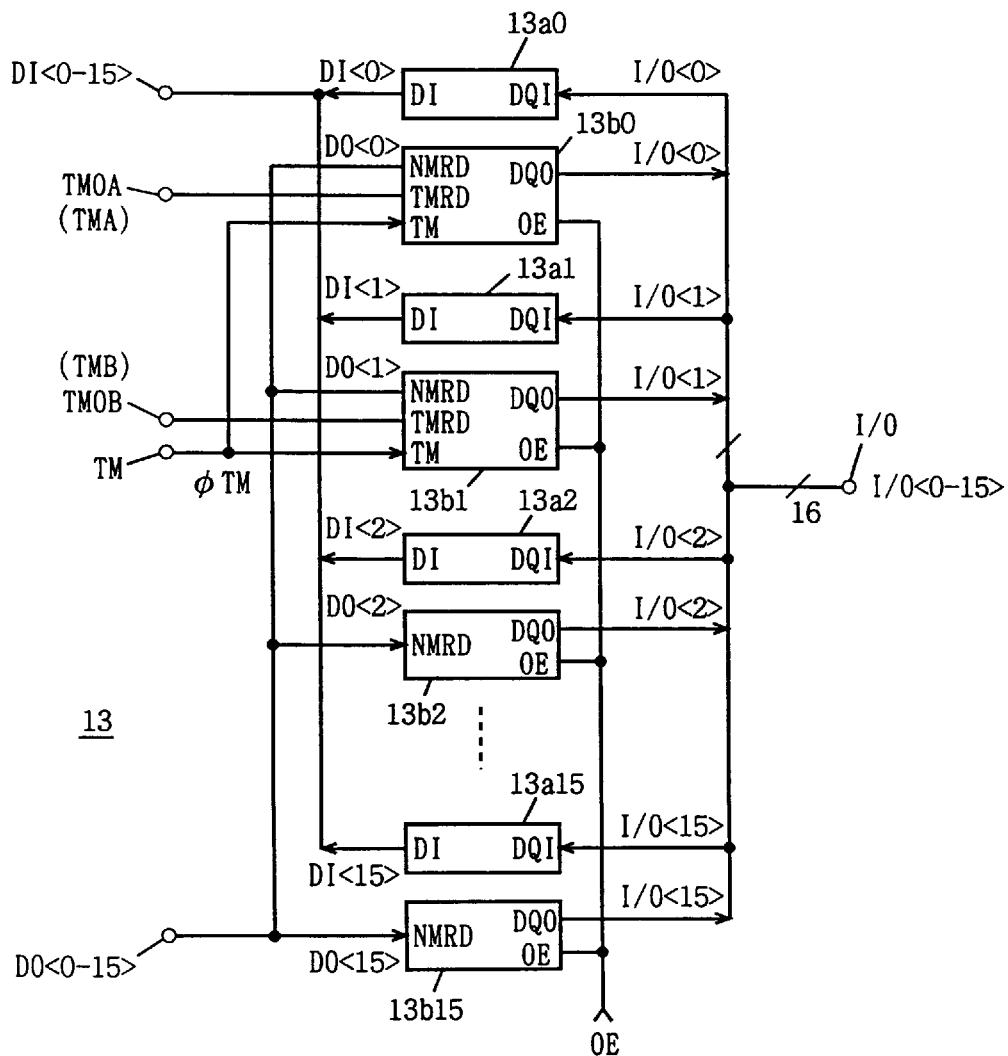
FIG. 14 is a diagram schematically showing the configuration of an input/output circuit shown in FIG. 2.

FIG. 14 is a diagram schematically showing the configuration of the input/output circuit shown in FIG. 2. As shown in FIG. 14, input/output circuit 13 includes input buffer circuits 13a0 to 13a15 provided corresponding to input/output data I/O<0>–I/O<15> supplied to data input/output nodes I/O to buffer corresponding writing data I/O<0> to I/O<15> and produce internal writing data DI<0> to DI<15>, and output buffer circuits 13b0 to 13b15 provided corresponding to internal reading data DO<0> to DO<15> supplied to node DO<0–15> to buffer the received data and produce reading data I/O<0> to I/O<15> for parallel output to data input/output node I/O in response to an activation of output enable signal OE in the normal operation mode.

Output buffer circuit 13b0 provided corresponding to data I/O<0> includes a node NMRD receiving data DO<0> read out from a corresponding memory cell, a node TMRD receiving an output signal from the node TMA of the global determination circuit in FIG. 13 through node TMOA, a node TM receiving test mode activation signal φTM, a node OE receiving output enable signal OE and a node DQO to output data. Output buffer circuit 13b0 selects data applied to node TMRD and outputs the data through output node DQO as reading data I/O<0> when test mode activation signal φTM is activated. When test mode activation signal φTM is in an inactive state, output buffer circuit 13b0 selects reading data DO<0> applied to node NMRD and outputs the data as data I/O<0> through node DQO.

Output buffer circuit 13b1 provided corresponding to internal reading data DO<1> includes a node TM receiving test mode activation signal φTM, a node NMRD receiving corresponding memory cell data DO<1>, a node TMRD receiving a coincidence/non-coincidence indication signal output from the node TMB of the global determination circuit shown in FIG. 13 through node TMOB, a node OE receiving output enable signal OE, and a data output node DQO. Output buffer circuit 13b1, as is with output buffer circuit 13b0, selects data DO<1> supplied to node NMRD and outputs the data through node DQO in response to output enable signal OE when test mode activation signal φTM is inactive. When test mode activation signal φTM is activated, data output buffer circuit 13b1 selects data supplied to node TMRD and outputs the data as data I/O<1> through node DQO in response to an activation of output enable signal OE.

The remaining output buffer circuits 13b2 to 13b15 each have a node NMRD receiving a corresponding one of data DO<2> to DO<15>, a node OE receiving output enable signal OE, and a data output node DQO. These output buffer circuits 13b2 to 13b15 have the same configuration, and buffer the received data DO<2> to DO<15> respectively for output.

Internal writing data DI<0> to DI<15> output through node DI<0–15> are provided corresponding to writing circuits. Writing data DI<0> is further commonly supplied to each writing circuit (for the purpose of writing test data).

Figure 15:
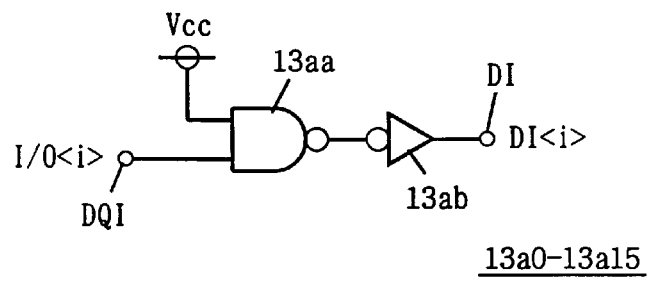
FIG. 15 is a diagram specifically showing the configuration of an input buffer circuit shown in FIG. 14.

FIG. 15 is a diagram showing a specific example of the configuration of each of input buffer circuit 13a0 to 13a15 shown in FIG. 14. Since these input buffer circuits 13a0 to 13a15 have the same configuration, only one input buffer circuit is shown in FIG. 15.

As shown in FIG. 15, input buffer circuits 13a0 to 13a15 each include an NAND circuit 13aa receiving corresponding input data I/O<i> supplied to node DQI and power supply voltage Vcc, and an inverter 13ab receiving the output signal of NAND circuit 13aa. Internal writing data DI<i> is produced through node DI from inverter 13ab. NAND circuit 13aa receives the power supply voltage to be a signal having a logic "1" at its one input, and functions as an inverter. NAND circuit 13aa is used as an input stage, in order to adapt the voltage level to the amplitude of input signal I/O<i> when the logic of the input signal is determined as logic "1"/"0" (in order to adjust a determination reference value by changing the threshold voltage of a component, MOS transistor).

Input buffer circuits 13a0 to 13a15 shown in FIG. 15 are equivalent to two stages of cascaded inverters, and buffer data I/O<i> at node DQI to produce internal writing data DI<i>.

Figure 16:
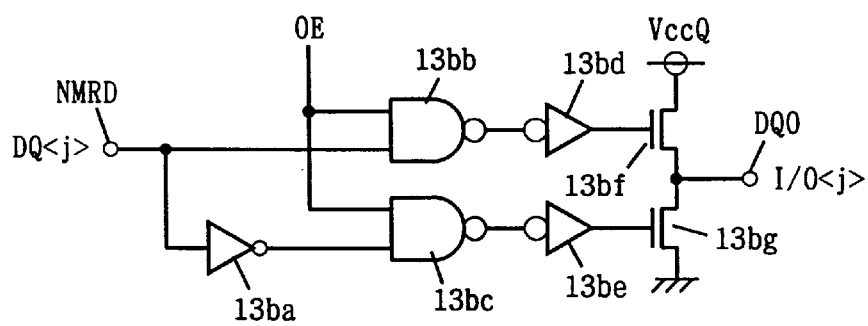
FIG. 16 is a diagram specifically showing the configuration of an example of an output buffer circuit shown in FIG. 14 by way of illustration.

FIG. 16 is a diagram showing a specific example of the configuration of each of output buffer circuits 13b2–13b15. In FIG. 16, since these output buffer circuits 13b2 to 13b15 have the same configuration, only one output buffer circuit is shown.

In FIG. 16, output buffer circuits 13b2 to 13b15 each include an inverter circuit 13ba receiving corresponding reading data DO<j> supplied at node NMRD, an NAND circuit 13bb receiving output enable signal OE and reading data DO<j>, an NAND circuit 13bc receiving output enable signal OE and the output signal of inverter circuit 13ba, an inverter circuit 13bd receiving the output signal of NAND circuit 13bb, an inverter circuit 13be receiving the output signal of NAND circuit 13bc, an n-channel MOS transistor 13bf which is rendered conductive when the output signal of inverter circuit 13bd attains an H level (logic "1"), to supply current from power supply node VccQ to output node DQO and output a logic "1" signal, and an n-channel MOS transistor 13bg which is rendered conductive when the output signal of inverter circuit 13be attains an H level, to discharge output node DQO to the ground potential level.

Power supply voltage VccQ is internal power supply voltage supplied exclusively for the output buffer circuit. Now, the operation will be briefly described.

When output enable signal OE is in an L level inactive state, the output signals of NAND circuits 13bb and 13bc are at an H level, the output signals of inverter circuits 13bd and 13be attain an L level, MOS transistors 13bf and 13bg are both rendered nonconductive, and node DQO attains a high impedance state.

When output enable signal OE attains an active state H level, NAND circuits 13bb and 13bc each operate as an inverter. When reading data DO<j> has a logic "1", MOS transistor 13bf has its gate potential brought to an H level and conducts, while MOS transistor 13bg has its gate potential brought to an L level, and MOS transistor 13bg is rendered nonconductive. Data I/O<j> is therefore output as an H level signal.

When reading data DO<j> has a logic "0" (L level), the gate potential of MOS transistor 13bf attains an L level, and the gate potential of MOS transistor 13bg attains an H level. Output node DQO is discharged to the ground voltage level by MOS transistor 13bg, and output data I/O<j> becomes L level data.

Figure 17:
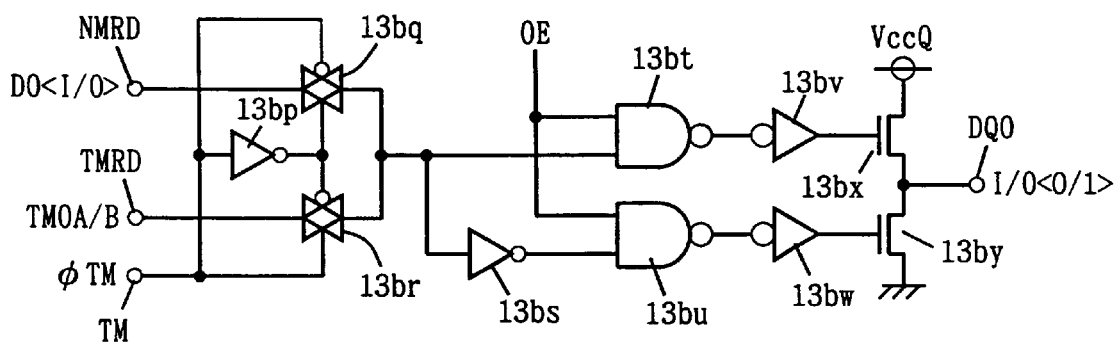
FIG. 17 is a diagram showing the configuration of a specific example of an output buffer circuit for selectively outputting determination result data and internal reading data shown in FIG. 14.

FIG. 17 is a specific example of the configuration of each of output buffer 13ba and 13b1 in FIG. 4. In FIG. 17, these output buffers 13b0 and 13b1 have the same configuration, and therefore only one output buffer circuit is shown.

In FIG. 17, output buffer circuits 13b0 and 13b1 each include an inverter circuit 13bp receiving test mode activation signal φTM applied to node TM, a transmission gate 13*bq* which is rendered conductive in response to test mode activation signal φTM and the output signal of inverter circuit 13*bp* and transmits corresponding reading data DO</0> supplied to node NMRD, a transmission gate 13*br* which conducts in a complementary manner to transmission gate 13*bq* in response to test mode activation signal φTM and the output signal of inverter circuit 13*bp* and transmits test result indication signal TMOA or TMOB applied to node TMRD, an inverter circuit 13*bs* receiving data applied from one of transmission gates 13*bq* and 13*br*, an NAND circuit 13*bt* receiving output enable signal OE and a signal applied from one of transmission gates 13*bq* and 13*br*, an NAND circuit 13*bu* receiving output enable signal OE and the output signal of inverter circuit 13*bs*, an inverter circuit 13*bv* receiving the output signal of NAND circuit 13*bt*, an inverter circuit 13*bw* receiving the output signal of NAND circuit 13*bu*, an n channel MOS transistor 13*bx* which conducts in response to an H level output signal from inverter circuit 13*bv* to drive output node DQO to power supply voltage VccQ level, and an n-channel MOS transistor 13*by* which conducts in response to an H level output signal from inverter circuit 13*bw* to discharge output node DQO to the ground voltage level. Reading data I/O<0/1> is output from output node DQO. Data DO<1/0> and I/O<1> indicate one of data DO<1> and DO<0> and one of I/O<0> and I/O<1>, respectively. Now, the operations of output buffer circuits 13*b*0 and 13*b*1 shown in FIG. 17 will be described.

When output enable signal OE is in an L level inactive state, the output signals of inverter circuits 13*bv* and 13*bw* are at an L level, MOS transistor 13*bx* and 13*by* are both in an inactive state, and output node DQO is in a high impedance state.

When output enable signal OE attains an active state of H level, a signal having a logic corresponding to the logic of a signal transmitted from one of transmission gates 13*bq* and 13*br* is output to output node DQO. In the normal operation mode in which test mode activation signal φTM is in an inactive state, transmission gate 13*bq* conducts, internal data DO<1/0> supplied to node NMRD is transmitted, and a signal corresponding to the logic of reading data DO<1/0> is output to output node DQO. When test mode activation signal φTM is activated (H level), transmission gate 13*br* conducts, a test result indication signal TMOA or TMOB applied to node TMRD is selected, and output node DQ attains a logic level corresponding to the test result indication signal.

As described above, the signal applied to node TMRD is an H level or L level (logic "0" or "1") signal. Output buffer circuits 13*b*0 and 13*b*1 output a binary level signal to output node DQO if test mode activation signal φTM is in an active state and output enable signal OE is in an active state, and therefore output node DQO does not attain a high impedance state.

Data I/O<0> is output as a signal representing a coincidence/non-coincidence in a test result and the logic in coincidence when a coincidence is found, and a signal representing the coincidence/non-coincidence of the logics of data of simultaneously selected memory cells is output to the data input/output terminal of data I/O<1>. By monitoring the logic levels of signals at these data input/output terminals, the test result can be determined at a high speed.

As described above, according to the first embodiment of the invention, since the logic of writing data can be internally set for each data input/output terminal, more flexible test data patterns are obtained, and therefore highly reliable testing can be implemented. In addition, at the time of outputting a test result signal, only binary determination is employed, in other words no output high impedance state is present, and therefore the test cycle period can be reduced.

Second Embodiment

Figure 18:
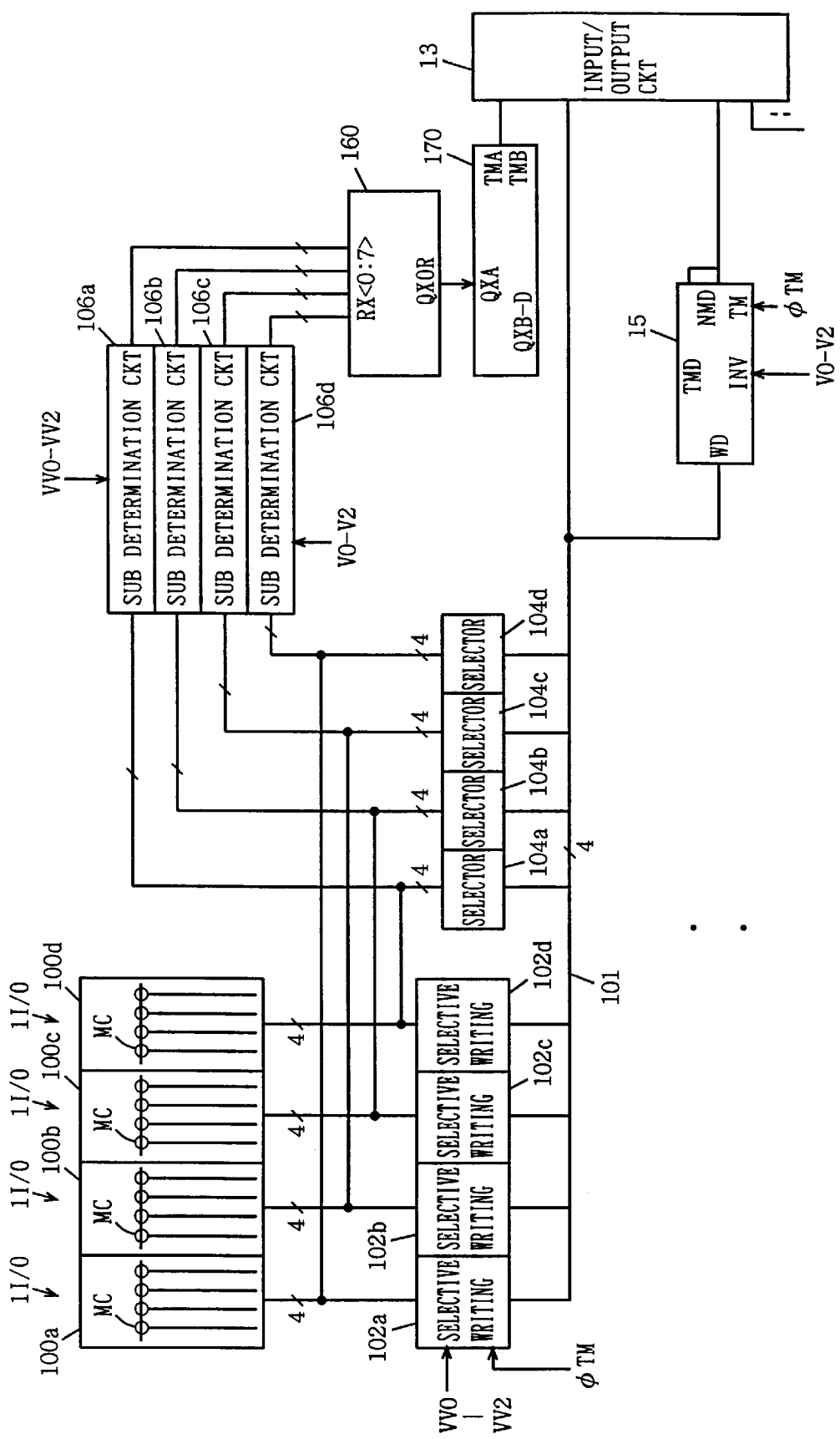
FIG. 18 is a diagram schematically showing the configuration of a main part of a semiconductor memory device according to a second embodiment of the invention.

FIG. 18 is a diagram schematically showing the configuration of a main portion of a semiconductor memory device according to a second embodiment of the invention. FIG. 18 shows the configuration of a portion related to one memory mat. In FIG. 18, the memory mat includes four array blocks 100*a* to 100*d*. Array blocks 100*a* to 100*d* each correspond to a 1 bit-data input/output node. In each of array blocks 100*a* to 100*d*, a plurality of (four in the shown embodiment) memory cells MC are simultaneously selected.

Corresponding to each of array blocks 100*a* to 100*d*, there are provided selective writing circuits 102*a*, 102*b*, 102*c* and 102*d* coupled to internal input/output bus 101 to select a corresponding data bit, and selectively write the data into a memory cell addressed among memory cells of 4 bits in a corresponding array block. These selective writing circuits 102*a* to 102*d* each change the logics of received writing data based on mode setting data VV0 to VV2 when test mode activation signal φTM is activated, and write data into memory cells of 4 bits within a corresponding array block. As a result, in array blocks 100*a* to 100*d*, data having different logics can be written into memory cells MC of 4 bits.

The semiconductor memory device further includes sub determination circuits 106*a*, 106*b*, 106*c* and 106*d* provided corresponding to array blocks 100*a* to 100*d*, respectively to change the logic levels of data read out from corresponding array blocks based on mode setting data VV0 to VV2 and V0 to V2, and determine the coincidence/non-coincidence of the changed logic levels of data, and selecting circuits 104*a*, 104*b*, 104*c* and 104*d* provided corresponding to array blocks 100*a* to 100*d*, respectively and each activated at the time of reading data to select single addressed memory cell data among 4 bits of memory cell data read out from a corresponding array block and transmit the selected data onto an internal data bus 101. Internal data bus 101 is coupled to input/output circuit 13.

The results of determination by sub determination circuits 106*a* to 106*d* are supplied to a local determination circuit 160 having a configuration different from that according to the first embodiment. Local determination circuit 160 further determines the coincidence/non-coincidence of the logic levels of the results of determination from subdetermination circuits 106*a* to 106*d*, and the result of determination is supplied to a global determination circuit 170.

Global determination circuit 170 receives data representing results of determination from the remaining memory mats at input nodes QXB-QXD, these paths are not shown for the simplification of illustration. The results of determination by global determination circuit 170 is supplied to input/output circuit 13, and to a particular data input/output node as is with the first embodiment of the invention.

In order to write data to data input/output bus 101, there is provided a writing circuit 15 which receives corresponding four bits of memory cell data from input/output circuit 13 at node NMD, and particular 1-bit data in the test mode at node TMD, and produces internal writing data WD for transmission to internal data bus 101. Writing circuit 15 selectively changes the logic of test mode data (data DI<0> applied to node TMD) based on mode setting data V0–V2 when test mode activation signal φTM is activated. The configurations of input/output circuit 13, writing circuit 15 and global determination circuit 170 are the same as those according to the first embodiment. The operation will be now briefly described.

In the normal operation mode, writing data from input/output circuit 13 is supplied to internal data bus 101 through writing circuit 15. Selective writing circuits 102a to 102d each write data into one memory cell of four memory cells in a corresponding array block in response to a select signal which is not shown, when test mode activation signal φTM is in an inactive state. Thus, 1-bit data for each of array blocks 100a to 100b, in other words data of four bits in total are written in parallel.

At the time of reading out data, a selecting operation is performed in response to a select signal which is not shown in selecting circuits 104a to 104d, one-bit memory cell data is selected from four bits of each memory cell data read out from each of array blocks 100a to 100d and supplied onto internal data bus 101. The data read out onto internal data bus 101 is transmitted to a data input/output node which is not shown through input/output circuit 13.

In the testing operation mode, writing circuit 15 performs logic change specified by mode setting data V0–V2 to test data supplied to node TMD in response to an activation of test mode activation signal φTM, and transmits the resultant data from node WD to internal data bus 101. Selective writing circuits 1021 to 102d each perform logic change to the data of corresponding bits in the internal data bus according to mode setting data VV0–VV2 and produce four bits of data. Four bits of data in each of these selective writing circuit 102a to 102d are written into memory cells of four bits simultaneously selected in corresponding array blocks 102a to 102d.

At the time of reading data, 4-bit data read out from each of array blocks 100a to 100d are supplied to sub determination circuits 106a to 106d. Sub determination circuits 106a to 106d having the same configuration as local determination circuit 16 changes the logic levels of the read out corresponding 4-bit data based on mode setting data VV0 to VV2, and then changes the logics of reading data according to mode setting data V0 to V2. Thereafter, a signal representing whether data all have a logic "1" or "0".

Local determination circuit 160 receives signals representing the results of determination applied from subdetermination circuits 106a to 106d at nodes RX<0–3>, determines whether there is a coincidence in logic between the signals, and outputs a signal representing the result of determination to node QXOR. Global determination circuit 170 performs a determination operation the same as that in the first embodiment in response to the signals representing the results of determination applied from the local determination circuits, and outputs a signal representing the coincidence/non-coincidence of the logic levels and a signal representing the logic in coincidence.

Figure 19:
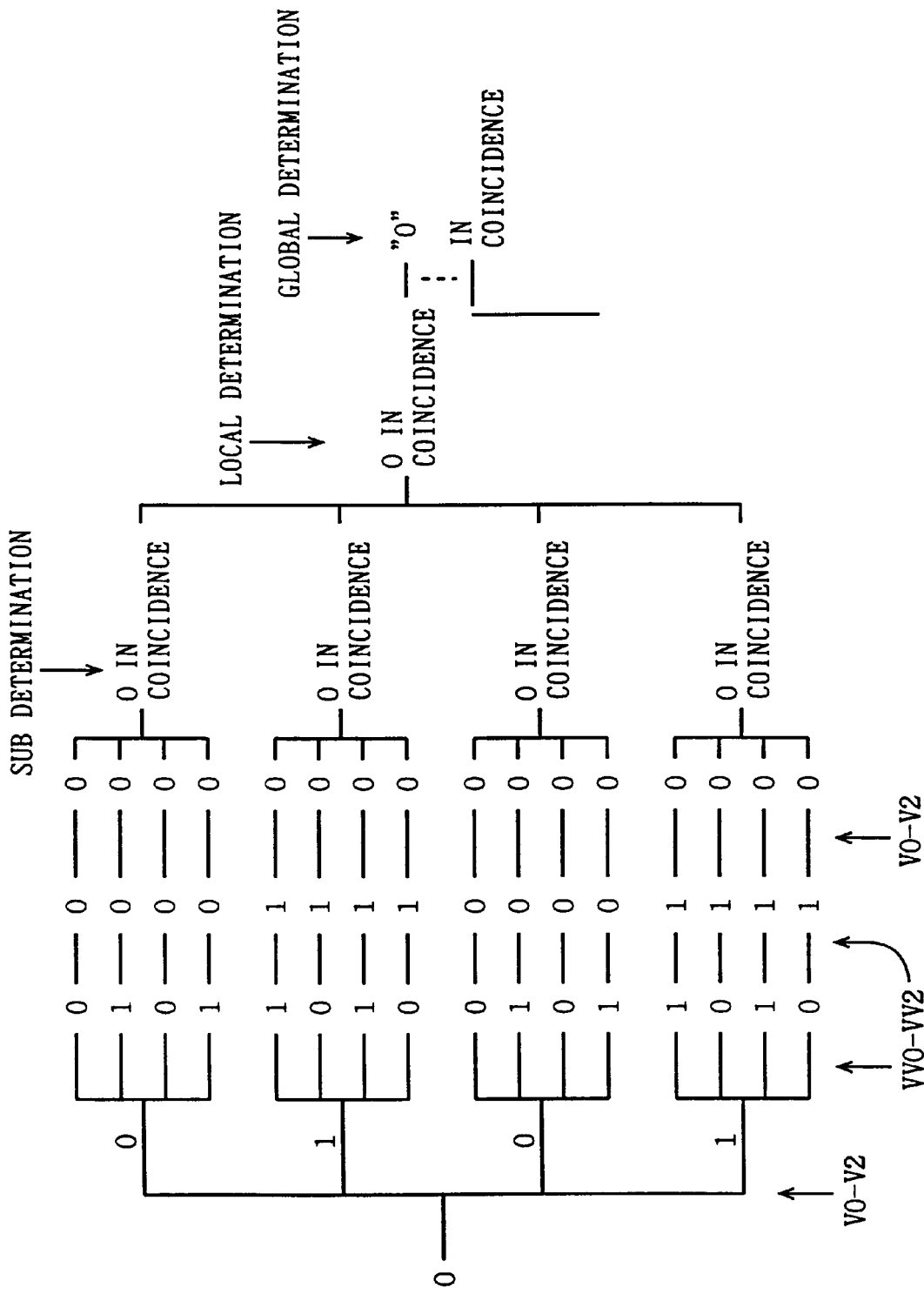
FIG. 19 is a diagram schematically showing the flow of data during testing operation by the semiconductor memory device shown in FIG. 18.

FIG. 19 is a diagram showing a specific example of the data flow during the testing operation. In FIG. 19, the data flow for one memory mat is shown. Test data "0" is changed into 4-bit data "0101" according to mode setting data V0–V2. The data is supplied to a selective writing circuit. The selective writing circuit further changes the applied data according to mode setting data VV0 to VV2. Data "0" is changed into "0101", data "1" is changed into "1010", and they are written into corresponding memory arrays.

The 4-bit data of memory cells selected from a memory array has its logic inverted according to mode setting data VV0–VV2, data "0101" is changed into data "0000", and data "1010" is converted to data "1111". These data are further changed according to mode setting data V0 to V2, data "1111" which has been inverted in logic is converted to data "0000", and subdetermination circuits 106a to 106d determine coincidence/non-coincidence of the data. The sub determination portion determines that data bits are in coincidence in logic "0", and the result of determination is applied to the local determination circuit. The local determination circuit detects the coincidence in data "0" according to the coincidence detection results from these subdetermination portions, and the result of determination is transmitted to the global determination circuit. The global determination circuit further detects a coincidence, and the logic "0" data in coincidence is output.

If a non-coincidence is detected at the sub determination portions, a non-coincidence is necessarily generated at the local determination portion, and a non-coincidence is generated at the global determination portion as well. Now, the configuration of each portion will be described.

Writing circuit 15 is the same as that in the first embodiment.

Figure 20:
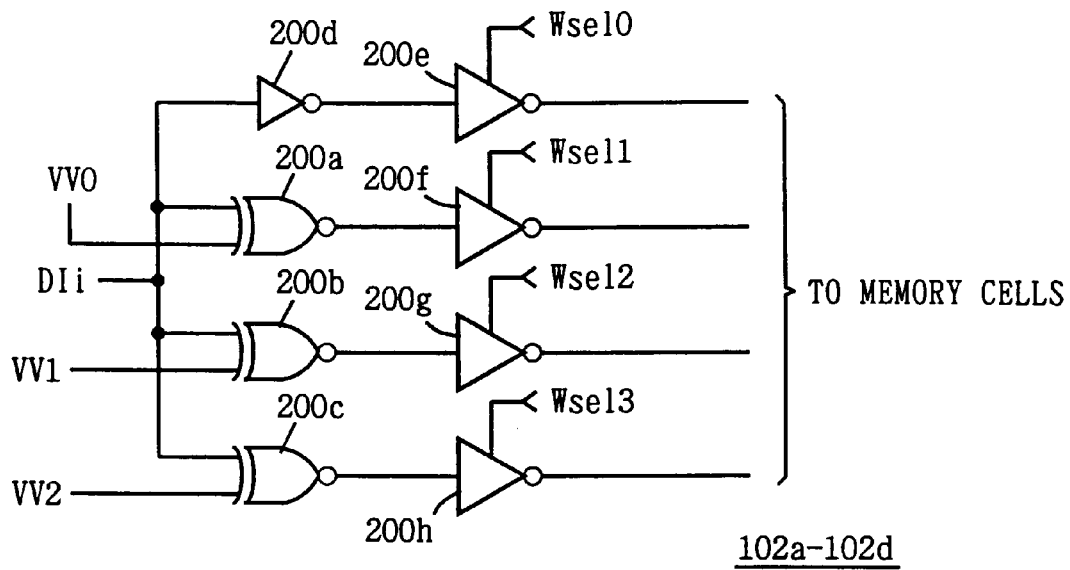
FIG. 20 is a diagram showing the configuration of an example of a selective writing circuit shown in FIG. 18.

FIG. 20 is a diagram showing a specific example of the configuration of each of selective writing circuits 102a to 102d in FIG. 18. In FIG. 20, selective writing circuits 102a to 102d have the same configuration, and therefore only one selective writing circuit is shown.

In FIG. 20, selective writing circuits 102a to 102d each include an exclusive NOR circuit 200a receiving corresponding writing data DIi and mode setting data VV0, an exclusive NOR circuit 200b receiving internal writing data DIi and mode setting data VV1, an exclusive NOR circuit 200c receiving writing data DIi and mode setting data VV2, an inverter circuit 200d receiving writing data DIi, a writing drive circuit 200e activated in response to an activation of a writing activation signal wsel0 to invert and amplify a signal applied from inverter 200d and write the resultant signal in a corresponding memory cell, a writing drive circuit 200f activated in response to an activation of a writing activation signal wsel1 to invert and amplify the output signal of corresponding exclusive NOR circuit 200a and write the result to a corresponding memory cell, a writing drive circuit 200g activated in response to an activation of a writing select signal wsel2 to invert and amplify the output signal of corresponding exclusive NOR circuit 200b and write the result in a corresponding memory cell, and a writing drive circuit 200h activated in response to an activation of writing activation signal wsel3 to invert and amplify the output signal of exclusive NOR circuit 200c and write the result in a corresponding memory cell. Writing drive circuits 200e to 200h each attain an output high impedance state when a corresponding writing activation signal is in an inactive state.

One of writing activation signals wsel0 to wsel3 is activated in the normal operation mode. When test mode activation signal φTM is activated, all these writing activation signals wsel0 to wsel3 are activated at the time of writing data, and 4-bit memory cell data is written.

The exclusive NOR circuit generally operates as an inverter when a logic "0" signal is applied to its one input, and operates as a buffer circuit when a logic "1" signal is applied to that one input. Writing driving circuits 200e to 200h are inverter circuits. Therefore, by setting mode setting data VV0 to VV2 to logic "1", corresponding exclusive NOR circuits 200a to 200c operate as buffers, which enables data having an inverted logic to be written into a memory cell.

In the normal operation mode, mode setting data VV0 to VV2 are set to logic "0", and these exclusive OR circuits 200a to 200c operate as inverter circuits. Thus, in the normal operation mode, data having the same logic as input data DIi can be written and in the testing mode, the logic of data to be written into a memory cell can be selectively set.

Figure 21:
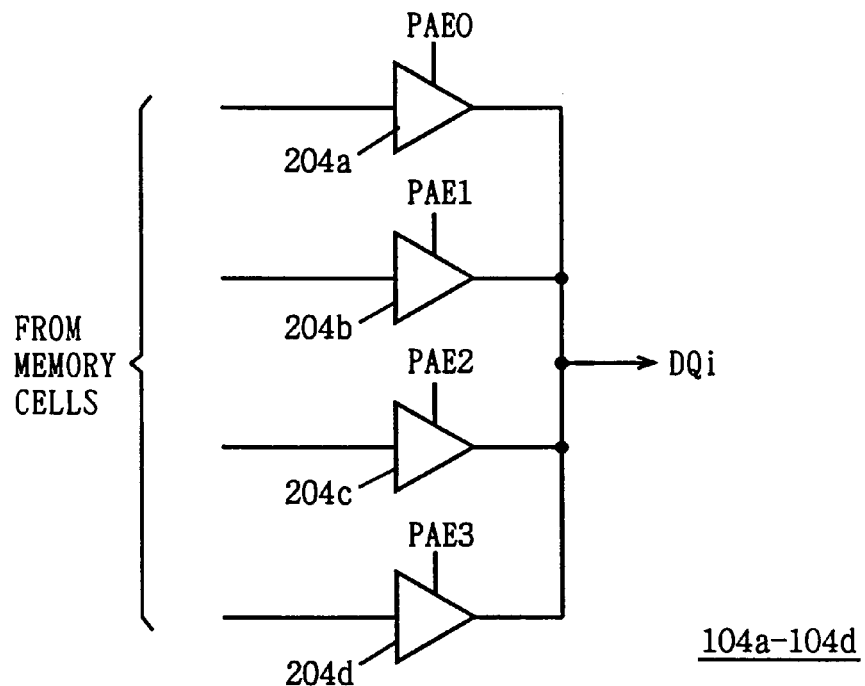
FIG. 21 is a diagram showing the configuration of an example of a selecting circuit shown in FIG. 18 by way of illustration.

FIG. 21 is a diagram specifically showing the configuration of each of selecting circuit 104a to 104d in FIG. 18. In FIG. 21, since these selecting circuits 104a to 104d have the same configuration, only one selecting circuit is shown.

In FIG. 21, selecting circuits 104a to 104d each include a reading amplification circuit 204a activated in response to an activation of a reading amplification activation signal PAE0 to amplify and output data read out from a corresponding memory cell, a reading amplification circuit 204b activated in response to an activation of a reading amplification activation signal PAE1 to amplify data read out from a corresponding memory cell, a reading amplification circuit 204c activated in response to an activation of a reading amplification activation signal PAE2 to amplify data read out from a corresponding memory cell, and a reading amplification circuit 204d activated in response to an activation of an amplification activation signal PAE3 to amplify data read out from a corresponding memory cell. Only one of reading amplification activation signals PAE0 to PAE3 is activated in any of the normal operation mode and testing operation mode. Selecting circuits 104a to 104d do not receive test mode activation signal φTM. Reading amplification circuits 204a to 204d each attain an output high impedance state when inactivated.

Figure 22:
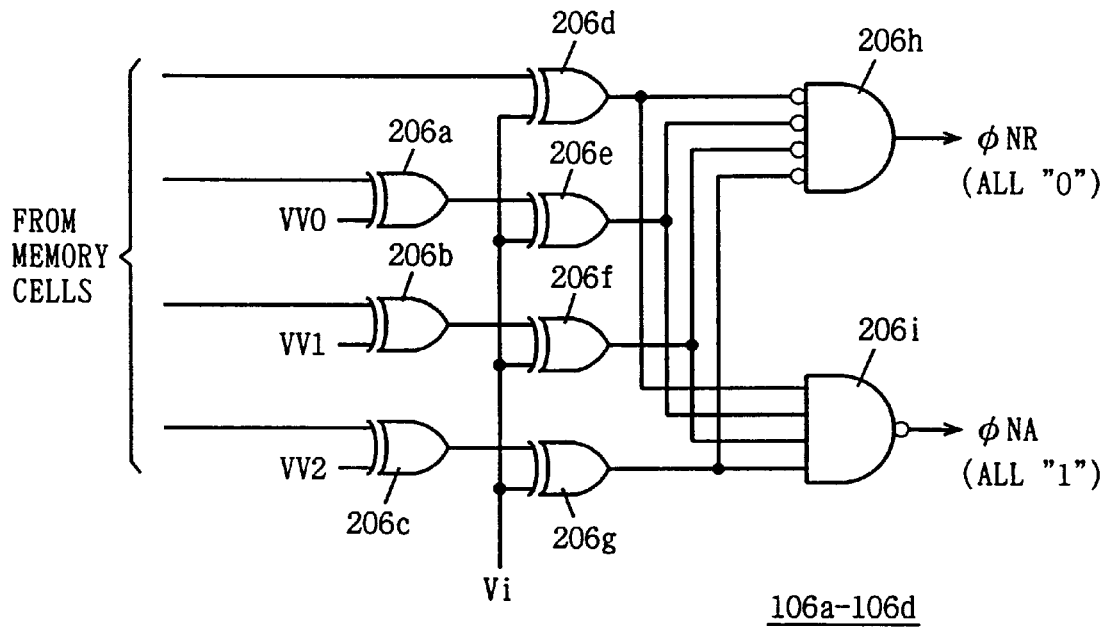
FIG. 22 is a diagram showing the configuration of an example of a subdetermination circuit shown in FIG. 18.

FIG. 22 is a diagram specifically showing the configuration of each of subdetermination circuits 106a to 106d in FIG. 18. The subdetermination circuit in FIG. 22 is for data I/O which is produced by changing writing data based on mode setting data V0 to V2. In the respective memory mats, an array block for a data input/output node which will not be subjected to logic setting according to mode setting data V0 to V2 is not supplied with data Vi in the configuration shown in FIG. 22 and a corresponding portion is removed or data Vi is fixed to logic "0".

In FIG. 22, subdetermination circuits 106a to 106d each include an exclusive OR circuit 206a receiving data read out from a corresponding memory cell and setting data VV0, an exclusive OR circuit 206b receiving data read out from a corresponding memory cell and mode setting data VV1, and an exclusive OR circuit 206c receiving data read out from a corresponding memory cell and mode setting data VV2. These exclusive OR circuits 206a to 206c are provided corresponding to memory cells of 3 bits. The remaining one bit memory cell is not subjected to data logic inversion, and therefore no such configuration for restoring the data logic to the original state is provided.

Subdetermination circuits 106a to 106d each further include an exclusive OR circuit 206d receiving the remaining 1-bit memory cell data and mode setting data Vi (one of V0–V2), an exclusive OR circuit 206e receiving the output signal of exclusive OR circuit 206a and mode setting data Vi, an exclusive OR circuit 206f receiving the output signal of exclusive OR circuit 206b and mode setting data Vi, and an exclusive OR circuit 206i receiving the output signal of exclusive OR circuit 206c and mode setting data Vi. Mode setting data Vi is common to 16-bits memory cells selected simultaneously per one data input/output node.

Subdetermination circuits 106a to 106d each further include an NOR circuit 206h receiving the output signals of exclusive OR circuits 206d to 206g, and an NAND circuit 206i receiving the output signals of exclusive OR circuits 206d to 206g. Now the operation will be described.

Exclusive OR circuits 206a to 206g each operate as a buffer circuit when mode setting data applied to its one input has a logic "0", and operate as an inverter circuit when data applied to its one input has a logic "1". Thus, by writing selecting circuits 102a to 102d in FIG. 20, data having a logic set using exclusive NOR circuits and inverter circuits can be changed to data having the original logic using mode setting data VV0–VV2.

Furthermore, by providing exclusive OR circuits 206d to 206g, data having a logic set based on mode setting data Vi can be changed into the original data.

A NOR circuit 206h outputs a logic "1" signal φNR when the output signals of these exclusive OR circuits 206d to 206g all have a logic "0". NAND circuit 206i outputs a logic "1" signal φNA when the output signals of exclusive OR circuit 206d to 206g all have a logic "1". As a result, a signal φNR indicating that data to be read out all have a logic "0" is output from NOR circuit 206h, and a signal φNA indicating that data to be read out all have a logic "1" is output from NAND circuit 206a.

Figure 23:
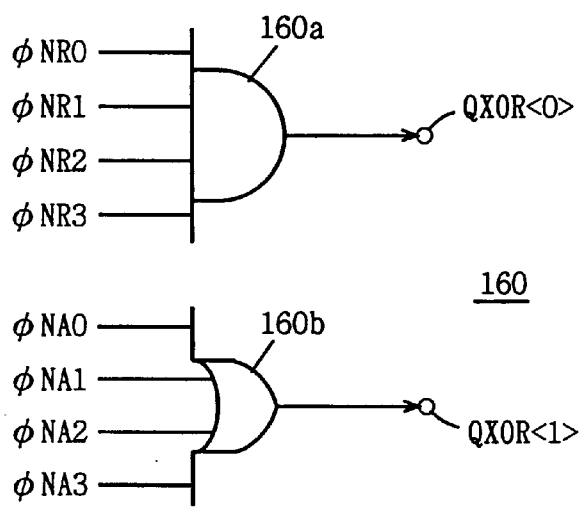
FIG. 23 is a diagram showing the configuration of an example of a local determination circuit shown in FIG. 18.
Figure 24:
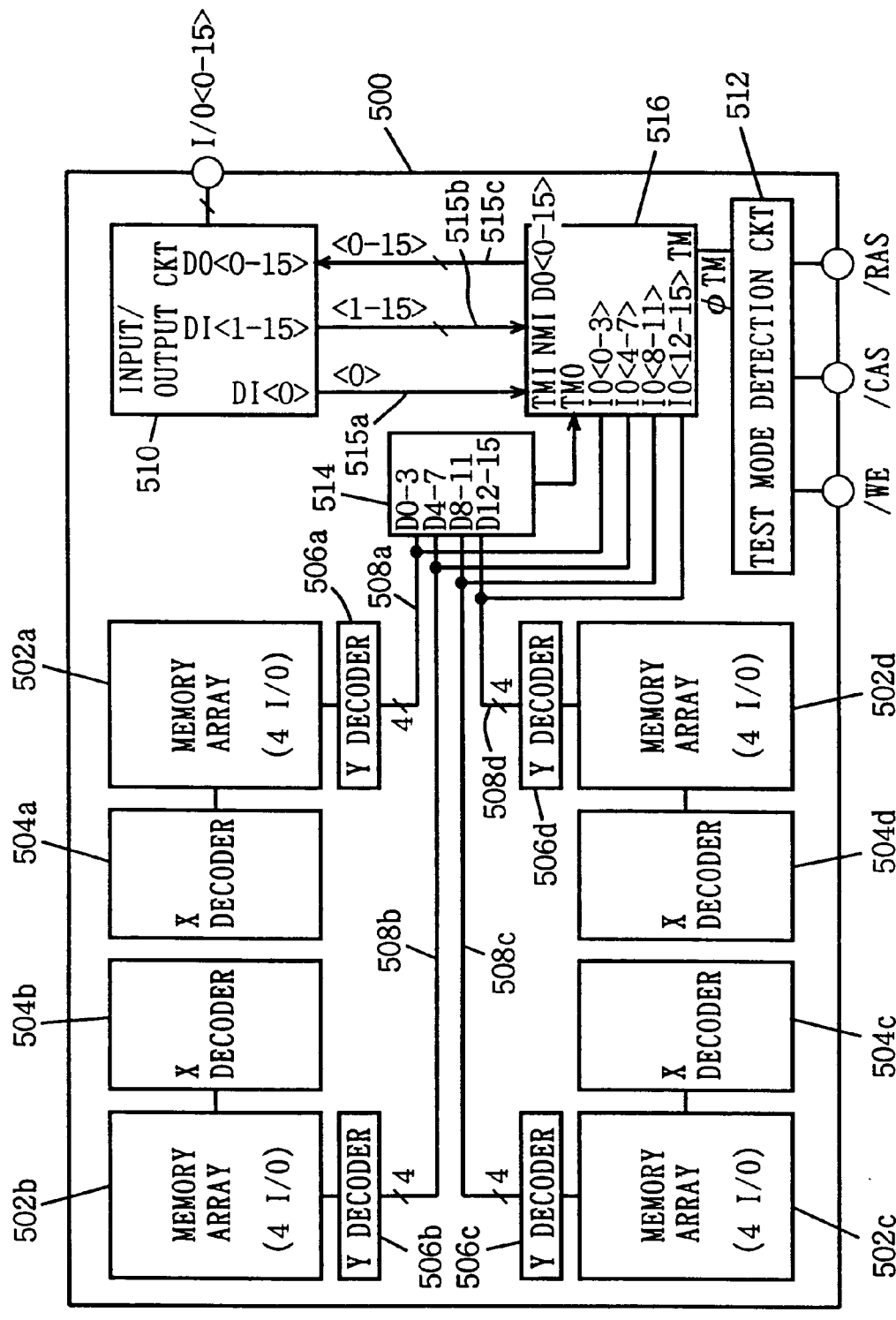
FIG. 24 is a diagram schematically showing an overall configuration of a conventional semiconductor memory device.
Figure 25:
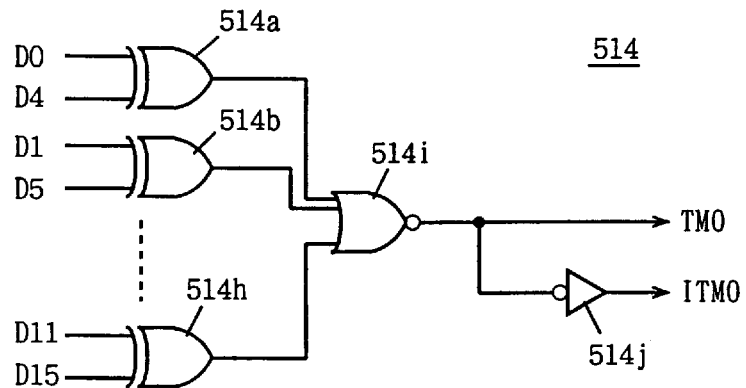
FIG. 25 is a diagram showing the configuration of an example of a test result determination circuit in a conventional semiconductor memory device.
Figure 26:
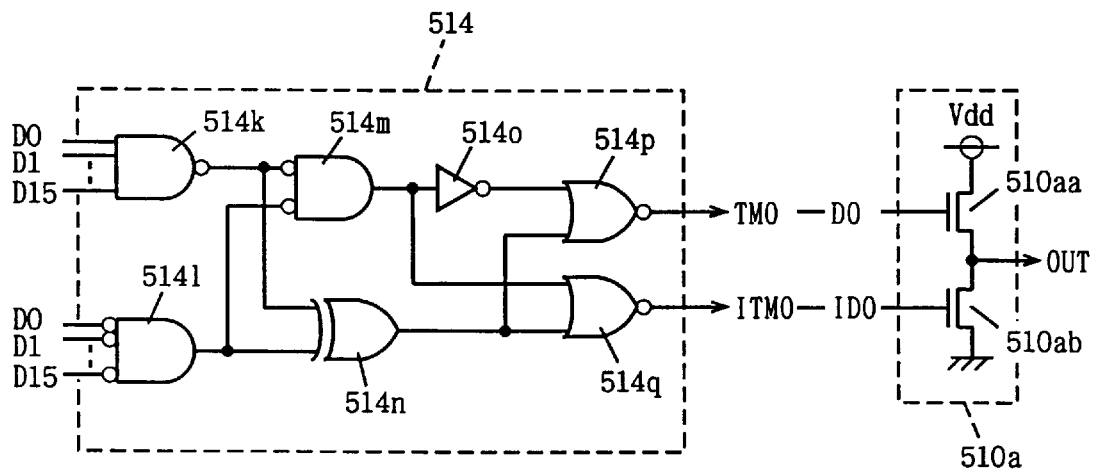
FIG. 26 is a diagram showing the configuration of another example of a test result determination circuit and an output circuit in a conventional semiconductor memory device.
Figure 27:
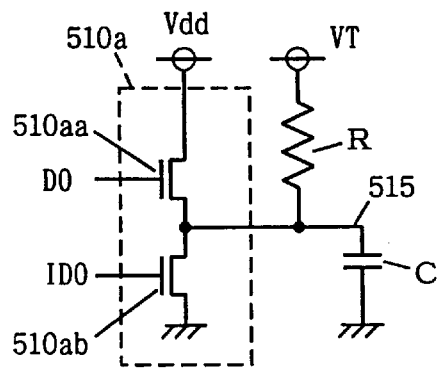
FIG. 27 is a diagram schematically showing the configuration of a data output portion for implementing ternary determination by a conventional semiconductor memory device.
Figure 28:
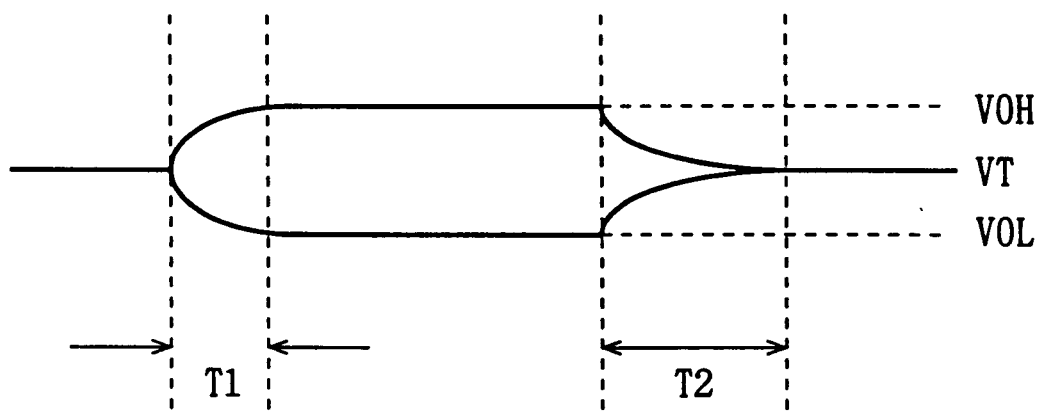
FIG. 28 is a diagram for use in illustration of a problem associated with the ternary determination shown in FIG. 27.

FIG. 23 is a diagram showing an example of the configuration of local determination circuit 160 shown in FIG. 18. As shown in FIG. 23, local determination circuit 160 includes an AND circuit 160a receiving all 0 indication signals φNR0 to φNR3 output from subdetermination circuits 106a to 106d, respectively, and an OR circuit 160b receiving all 1 indication signals φNA0 to φNA3 output from subdetermination circuits 160a to 160d, respectively. AND circuit 160a outputs a signal indicating whether or not 16 bits of memory cell data in the memory mat all have a logic "0" to node QXOR<0>. OR circuit 160b outputs a signal indicating whether or not the 16 bits of memory cell data in the memory mat all have a logic "1" through node QXOR<1>.

If the 16 bits of memory cell data all have a logic "0", signals φNR0 to φNR3 are all H level signals, and a logic "1" signal is output to node QXOR<0>. Meanwhile, if the 16 bits of memory cell data all have a logic "1", signals φNA0 to φNA3 all have a logic "0", and a signal output from OR circuit 160b to node QXOR<1> has a logic "0". If there is a defective memory cell, at least one of signals φNR0 to φNR3 has a logic "0", and the signal of node QXOR<0> has a logic "0".

If at least one of signals φNA0 to φNA3 has a logic "1", the signal at node QXOR<1> has a logic "1".

Therefore, signals output to nodes QXOR<0> and QXOR<1> have the same logic as in the configuration in which one bit of memory cell data is read out corresponding to a single data input/output node as in the first embodiment.

Therefore, for global determination circuit 170, the same configuration as that according to the first embodiment may be employed. Thus, a signal indicating the coincidence/non-coincidence of logics of a total of 64 bits of memory cell data and the logic in coincidence can be output.

Note that the configurations in FIGS. 20 to 23 shown only by way of illustration, and a circuit implementing each logic may be formed of a selecting circuit using a transmission gate and an inverter circuit.

Mode setting data VV0 to VV2 are set using prescribed address signals under the WCBR condition, as is with mode setting data V0 to V2. Since an address signal is not necessary at the time of setting a test mode, an arbitrary address signal input terminal may be used.

As in the foregoing, according to the second embodiment of the invention, in addition to the configuration of setting the logic of test data for each data input/output terminal, a plurality of memory cells are selected for each data terminal, the logics of writing test data of these plurality of memory cells may be set individually and independently from each other inside, the test data pattern may be varied for various tests, which enables highly reliable testing. The 64 bits of memory cells can be tested at a time, and therefore the time required for testing can be reduced.

Note that the number of data input/output terminals is not limited to 16. The number of memory cells selected at a time in an array block is not limited to 4 either.

As described above, according to the present invention, data supplied from a prescribed data input/output terminal can have its logic changed independently and internally for each memory cell, the data is written into selected memory cells at least equal in number to data input/output terminals, and therefore test data of various patterns may be written using a single data input/output terminal.

Furthermore, the coincidence/non-coincidence of the logics of selected memory cell data is determined, a signal indicating the result of determination and the logic in coincidence if a coincidence is found is output, and binary determination is made in any of the cases. Ternary determination is not performed to set an output terminal to a high impedance state, which reduces the time required for the test cycle and a higher testing operation frequency can be used.

A plurality of pieces of data are simultaneously selected per one data input/output terminal, and data having its logic individually and independently set are stored in these memory cells, which enables high speed testing operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of data input/output nodes;
   a memory array having a plurality of memory cells;
   means for simultaneously selecting memory cells no less in number than said data input/output nodes from said memory array;
   writing changing means provided corresponding to the selected memory cells, for setting a logic level associated with data supplied from a prescribed one of said data input/output nodes individually and independently for each of the selected memory cells to produce write data for said each of the selected memory cells in activation of a particular operation mode; and
   writing means for simultaneously writing data from said writing changing means to the simultaneously selected memory cells.

2. The semiconductor memory device as recited in claim 1, further comprising:
   reading data changing means for changing logic levels associated with data read out of said simultaneously selected memory cells in the same manner as said writing changing means;
   first determination means for determining a coincidence in logic levels associated with output data from said reading changing means and outputting data indicating a logic level in coincidence to a particular first node of said plurality of data input/output nodes; and
   second determination means for determining a coincidence/non-coincidence between logic levels associated with the output data from said reading data changing means and outputting a signal representing the result of determination to a second one of said plurality of data input/output nodes.

3. The semiconductor memory device as recited in claim 2, wherein
   said memory array includes a plurality of memory mats each provided corresponding to a prescribed number of the data input/output nodes,
   said selecting means simultaneously selects said prescribed number of memory cells in each of the memory mats,
   said writing changing means includes means for changing writing data for each said memory mat on a mat by mat basis and individually and independently for each prescribed number of data in a manner common to all the memory mats, and
   said reading changing means includes means for changing data read out from the selected memory cells in the same manner as said writing changing means individually for each of the memory mats and in a manner common to all the memory mats.

4. The semiconductor memory device as recited in claim 3, wherein
   said writing changing means and said reading changing means share a register for latching an externally applied signal when said particular operation mode is specified and holding the latched signal as data to determine a manner of said changing.

5. The semiconductor memory device as recited in claim 4, wherein
   said register includes register circuits provided commonly to said plurality of memory mats and corresponding to the selected memory cells respectively in each of the memory mats.

6. The semiconductor memory device as recited in claim 1, wherein
   said writing means further includes selecting means provided corresponding to said data input/output nodes for selecting either of data supplied from corresponding data input/output nodes and data output from said writing changing means.

7. The semiconductor memory device as recited in claim 1, wherein
   said memory array includes a plurality of memory mats each provided corresponding to a prescribed number of the data input/output nodes,
   said selecting means simultaneously selects said prescribed number of memory cells in each of the memory mats, and
   said writing changing means includes means for changing the logic level of writing data individually for each of the memory mats and in a manner common to all the memory mats.

8. The semiconductor memory device as in claim 1, further comprising a changing mode setting circuit for setting the particular operation mode.

9. A semiconductor memory device, comprising:
   a memory array having a plurality of memory cells;
   a plurality of data input/output nodes;
   means for simultaneously selecting memory cells no less in number than to said plurality of data input/output nodes;
   first determination means for determining a coincidence/non-coincidence of the logic levels associated with data of the simultaneously selected memory cells and outputting a signal representing a logic level in coincidence if a coincidence is found to a first one of said plurality of data input/output nodes in a particular operation mode; and
   second determination means for determining a coincidence/non-coincidence of the logic of data said simultaneously selected memory cells and outputting a signal representing the result of determination to a second one of said plurality of data input/output nodes in said particular operation mode.

10. The semiconductor memory device as recited in claim 9, further comprising:

writing changing means provided corresponding to the selected memory cells for setting logic levels associated with data applied from a prescribed one of said data input/output nodes individually and independently for each of the selected memory cells in said particular operation mode, and means for simultaneously writing data from said writing changing means to said simultaneously selected memory cells.

11. The semiconductor memory device as recited in claim 10, further comprising reading changing means for changing the logic levels associated with data of said simultaneously selected memory cells in the same manner as that by said writing changing means for application to said first and second determination means in said particular operation mode.

12. The semiconductor memory device as recited in claim 11, wherein said writing changing means and said reading changing means share a register for latching an externally applied signal and holding the latched signal as data to determine a manner of said changing, when said particular operation mode is specified.

13. The semiconductor memory device as recited in claim 12, wherein said register includes register circuits provided commonly to said plurality of memory mats and corresponding to the selected memory cells respectively in the memory mats.

14. The semiconductor memory device as recited in claim 10, wherein said writing means further includes selecting means provided corresponding to the respective data input/output nodes for selecting either of data supplied from corresponding data input/output nodes and corresponding output data from said writing changing means.

15. The semiconductor memory device as recited in claim 10, wherein said memory array includes a plurality of memory mats each provided corresponding to a prescribed number of the data input/output nodes, said selecting means simultaneously selects said prescribed number of memory cells in each of the memory mats, and said writing changing means includes means for changing writing data individually for each of the memory mats on a mat by mat basis and in a manner common to all the memory mats.

16. The semiconductor memory device as recited in claim 10, wherein said memory array includes a plurality of memory mats each provided corresponding to a prescribed number of the data input/output nodes, said selecting means simultaneously selects said prescribed number of memory cells in each of the memory mats, said writing changing means includes means for changing writing data individually and independently for each of the prescribed number of data in each of the memory mats and in a manner common to all the memory mats, and said reading changing means includes means for changing data read out from the selected memory cells in the same manner as said writing changing means does for each of the memory mats and in a manner common to all the memory mats.

17. The semiconductor memory device as recited in claim 16, wherein said writing changing means and said reading changing means share a register for latching an externally applied signal and holding the latched signal as data to determine a manner of said changing, when said particular operation mode is specified.

18. The semiconductor memory device as recited in claim 17, wherein said register includes register circuits provided commonly to said plurality of memory mats and corresponding to the selected memory cells respectively in the memory mats.

* * * * *